（12） United States Patent
Kanda

(10) Patent No.: US 8,741,537 B2
(45) Date of Patent: Jun. 3, 2014

(54) POSITIVE RESIST COMPOSITION AND PATTERN-FORMING METHOD USING THE SAME

(75) Inventor: Hiromi Kanda, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 513 days.

(21) Appl. No.: 11/366,420

(22) Filed: Mar. 3, 2006

(65) Prior Publication Data

US 2006/0199100 A1   Sep. 7, 2006

(30) Foreign Application Priority Data

Mar. 4, 2005 (JP) ............................. P.2005-060391

(51) Int. Cl.
*G03F 7/00* (2006.01)
*G03F 7/004* (2006.01)
*G03F 7/20* (2006.01)

(52) U.S. Cl.
USPC ................. 430/270.1; 430/913; 430/396

(58) Field of Classification Search
USPC .............................................. 430/270.1–325
See application file for complete search history.

(56) References Cited

U.S. PATENT DOCUMENTS

| 4,480,910 | A | | 11/1984 | Takanashi et al. |
| 5,939,242 | A | * | 8/1999 | Tang et al. ................... 430/329 |
| 6,242,153 | B1 | * | 6/2001 | Sato et al. ................. 430/270.1 |
| 7,060,775 | B2 | * | 6/2006 | Kishimura et al. ........... 526/288 |
| 7,122,292 | B2 | * | 10/2006 | Sumida et al. ............. 430/270.1 |
| 2003/0186161 | A1 | * | 10/2003 | Fujimori .................... 430/270.1 |
| 2004/0253542 | A1 | | 12/2004 | Rushkin et al. |
| 2004/0259008 | A1 | * | 12/2004 | Endo et al. ...................... 430/31 |
| 2005/0026074 | A1 | * | 2/2005 | Inabe et al. ................ 430/270.1 |
| 2005/0058935 | A1 | | 3/2005 | Kishimura et al. |
| 2005/0186505 | A1 | * | 8/2005 | Kodama et al. ............ 430/270.1 |
| 2006/0154171 | A1 | | 7/2006 | Hirayama et al. |

FOREIGN PATENT DOCUMENTS

| CA | 2 152 236 A1 | 12/1995 |
| EP | 0 652 485 A1 | 5/1995 |
| EP | 0 689 098 A1 | 12/1995 |
| EP | 0 773 478 A1 | 5/1997 |
| EP | 1 517 181 A1 | 3/2005 |
| JP | 57-153433 A | 9/1982 |
| JP | 63-049893 B | 10/1988 |
| JP | 08-050356 A | 2/1996 |
| JP | 9-73173 A | 3/1997 |
| JP | 10-326013 A | 12/1998 |
| JP | 2002-162746 A | 6/2002 |
| JP | 2003-301006 A | 10/2003 |
| JP | 2005-23092 A | 1/2005 |
| JP | 2005023092 A * | 1/2005 |
| JP | 2005-055890 A | 3/2005 |
| JP | 2005-126693 A | 5/2005 |
| JP | 2006-045387 A | 2/2006 |
| KR | 1998-080792 A | 11/1998 |
| KR | 10-0374447 B1 | 8/2003 |
| KR | 10-2005-0024620 A | 3/2005 |
| TW | 200426511 | 12/2004 |
| WO | WO 2004/074937 A1 | 2/2004 |
| WO | WO 2004/068242 A1 | 12/2004 |
| WO | WO 2005/003198 A | 1/2005 |

OTHER PUBLICATIONS

Partial European Search Report dated Jul. 6, 2006.
European Search Report dated Sep. 28, 2006.
Notification of Reasons for Refusal issued Aug. 31, 2010 in counterpart Japanese Application No. 2006-058328.
Office Action dated Nov. 20, 2012 in Taiwanese Patent Application No. 095107183.
Office Action dated Jul. 3, 2012 in Japanese Application No. 2010-244822.
Office Action dated Jun. 7, 2013 issued by the Taiwanese Patent Office in counterpart Taiwanese Patent Application No. 095107183.
Office Action dated Jul. 25, 2012 in Taiwanese Patent Application No. 095107183.
Office Action dated May 23, 2011 in European Patent Application No. 06004404.7.
Office Action dated Feb. 25, 2013 in Korean Patent Application No. 10-2006-0020705.
Office Action dated Sep. 27, 2013, issued by the Korean Intellectual Property Office in counterpart Korean Application No. 10-2006-0020705.
Office Action from the Korean Intellectual Property Office dated Jan. 24, 2014 in counterpart Korean Application No. 10-2006-0020705.

* cited by examiner

*Primary Examiner* — Amanda C. Walke
(74) *Attorney, Agent, or Firm* — Sughrue Mion, PLLC

(57) ABSTRACT

A positive resist composition, which comprises a resin having a structure showing a basicity and capable of increasing the solubility in an alkali developer by the action of an acid, and a pattern-forming method using the same.

10 Claims, No Drawings

POSITIVE RESIST COMPOSITION AND PATTERN-FORMING METHOD USING THE SAME

BACKGROUND OF THE INVENTION

1. Field of the Invention

The present invention relates to a positive resist composition used in a manufacturing process of semiconductor, such as IC, manufacture of circuit substrates for liquid crystals, thermal heads and the like, and lithographic processes of other photo-fabrication, and also the invention relates to a pattern-forming process using the same.

2. Background Art

With the progress of fining of semiconductor elements, shortening of the wavelengths of exposure light sources and increasing of the numerical aperture (high NA) of projection lens have advanced, and now exposure apparatus of NA 0.84 using an ArF excimer laser having a wavelength of 193 nm as the light source have been developed, which can be expressed by the following equations as generally known:

$$(\text{Resolution}) = k_1 \cdot (\lambda/\text{NA})$$

$$(\text{Depth of focus}) = \pm k_2 \cdot \lambda/\text{NA}^2$$

wherein λ is the wavelength of exposure light source, NA is the numerical aperture of the projection lens, and $k_1$ and $k_2$ are the coefficients concerning the process.

As a technique for increasing resolution in optical microscopes, a so-called immersion method of filling a liquid of high refractive index (hereinafter sometimes referred to as "immersion liquid") between a projection lens and a sample has been conventionally known.

As "the effect of immersion", the above resolution and depth of focus can be expressed by the following equations in the case of immersion, with $\lambda_0$ as the wavelength of the exposure light in the air, n as the refractive index of immersion liquid to the air, and $NA_0 = \sin \theta$ with θ as convergence half angle of the beam of light:

$$(\text{Resolution}) = k_1 \cdot (\lambda_0/n)/NA_0$$

$$(\text{Depth of focus}) = \pm k_2 \cdot (\lambda_0/n)/NA_0^2$$

That is, the effect of immersion is equivalent to the case of using exposure wavelength of the wavelength of 1/n. In other words, in the case of the projection optical system of the same NA, the depth of focus can be made n magnifications by immersion. This is effective for every pattern form, and further, this can be combined with super resolution techniques such as a phase shift method and a deformation lighting method now under discussion.

When ArF excimer laser is used as a light source, it is thought that pure water (refractive index at 193 nm: 1.44) is most promising in view of the safety in handling, and the transmittance and the refractive index at 193 nm.

Concerning immersion exposure techniques, a pattern-forming method on the basis of the process for immersion exposure is disclosed in patent literature 1 (JP-A63-49893, the term "JP-A" as used herein refers to an "unexamined published Japanese patent application"), resist compositions for use in a resist pattern-forming method including an immersion exposure process are disclosed in patent literature 2 (WO 2004/068242A1), and resist protective film-forming materials for immersion exposure process are disclosed in patent literature 3 (WO 2004/074937A1).

To explain the image-forming method of a chemical amplification type resist composition by example, this is an image-forming method of exposing a resist composition to decompose an acid generator in the exposed area to thereby generate an acid, utilizing the generated acid as a reactive catalyst in the bake after exposure PBE: Post Exposure Bake) to change an alkali-insoluble group to an alkali-soluble group, and removing the exposed area by alkali development.

The resist for ArF excimer laser (193 nm) using the mechanism of chemical amplification is now becoming the main stream, but exposure latitude from exposure to post-heating is not sufficient, so that further improvement is required.

Further, when a chemical amplification resist is applied to immersion exposure techniques for further fine pattern forming, a chemical amplification resist that undergoes no lithographic problem in general dry exposure causes fluctuations of sensitivity by immersion exposure, so that the improvement is required.

SUMMARY OF THE INVENTION

In vies of the prior art problems as above, an object of the invention is to provide a positive resist composition capable of making small a fluctuation of exposure latitude from an exposure to a post-heating by aging, and making small a sensitivity fluctuation between an immersion exposure and a general exposure, and another object is to provide a pattern-forming method using the same.

The invention is as follows.

1. A positive resist composition, which comprises a resin having a structure showing a basicity and capable of increasing the solubility in an alkali developer by the action of an acid.

2. The positive resist composition as described in the item 1, wherein the resin has the structure showing a basicity at the side chain.

3. The positive resist composition as described in the item 1, wherein the resin has the structure showing a basicity at the main chain terminal.

4. The positive resist composition as described in any one of the items 1 to 3, wherein the structure showing a basicity is a structure including at least one selecting from the group consisting of a primary, secondary or tertiary aliphatic amine, an aromatic amine, and a heterocyclic amine.

5. The positive resist composition as described in any one of the items 1 to 4, which comprises (B) a compound capable of generating an acid upon irradiation with an actinic ray or radiation.

6. A pattern-forming method, which comprises forming a resist film with the positive resist composition as described in any one of the items 1 to 5; and exposing and developing the resulting resist film.

7. The pattern-forming method as described in the item 6, wherein the resist film is subjected to an exposure through an immersion liquid The invention can provide a positive resist composition capable of making small the fluctuation of exposure latitude from exposure to post-heating by aging, and making small the sensitivity fluctuations between immersion exposure and general exposure, and a pattern-forming method using the same.

DETAILED DESCRIPTION OF THE INVENTION

The invention will be described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

[1] (A) A Resin Having a Structure Showing Basicity and Capable of Increasing the Solubility in an Alkali Developer by the Action of an Acid The positive resist composition in the invention contains a resin having a structure showing basicity and capable of increasing the solubility in an alkali developer by the action of an acid (hereinafter sometimes referred to as "acid-decomposable resin (A)").

As the structure showing basicity in acid-decomposable resin (A), e.g., the compounds having any of the structures represented by the following formulae (A) to (E) can be exemplified.

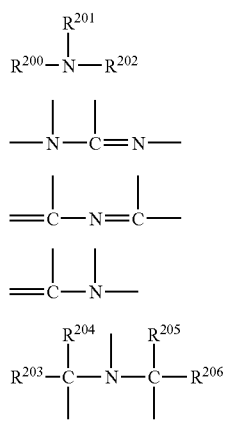

In formulae (A) to (E), $R^{200}$, $R^{201}$ and $R^{202}$, which may be the same or different, each represents a hydrogen atom, an alkyl group having from 1 to 20 carbon atoms, a cycloalkyl group having from 3 to 20 carbon atoms, or an aryl group having from 6 to 20 carbon atoms, and $R^{201}$ and $R^{202}$ may be bonded to each other to form a ring.

The above alkyl group may be substituted or unsubstituted, and as the substituted alkyl group, an aminoalkyl group having from 1 to 20 carbon atoms, a hydroxyalkyl group having from 1 to 20 carbon atoms, and a cyanoalkyl group having from 1 to 20 carbon atoms are preferably exemplified.

$R^{203}$, $R^{204}$, $R^{205}$ and $R^{206}$, which may be the same or different, each represents an alkyl group having from 1 to 20 carbon atoms.

As the structure showing basicity, structures having primary, secondary or tertiary aliphatic amines, aromatic amines, or heterocyclic amines are exemplified. The preferred substituents that these groups may have are a hydroxyl group, an amino group, an alkyl group, an alkoxyl group, an acyl group an acyloxy group, an aryl group, an aryloxy group, a nitro group, a cyano group, an ester group and a lactone group. As the aliphatic amine, e.g., ethylamine, n-propylamine, sec-butylamine, tert-butylamine, hexylamine, cyclohexylamine, octylamine, dodecylamine, ethylenediamine, tetraethylene-pentamine, dimethylamine, diethylamine, di-n-propylamine, diisopropylamine, di-n-butylamine, diisobutylamine, di-sec-butylamine, dipentylamine, dihexylamine, dicyclohexylamine, dioctylamine, didodecylamine, N,N-dimethylethylenediamine, N,N-dimethyltetraethylenepentamine, trimethylamine, triethylamine, tri-n-propylamine, triisopropylamine, tri-n-butylamine, triisobutylamine, tri-sec-butylamine, tripentylamine, trihexylamine, tricyclohexylamine, triheptylamine, trioctylamine, tridecylamine, tridodecyl-amine, N,N,N',N'-tetramethylmethylenediamine, N,N,N',N'-tetramethylethylenediamine, N,N,N',N'-tetramethyltetra-ethylenepentamine, dimethylethylamine, methylethylpropyl-amine, benzylamine, phenethylamine, benzyldimethylamine, monoethanolamine, diethanolamine, triethanol-amine, N-ethyldiethanolamine, N,N-diethylethanolamine, triisopropanolamine, 2-aminoethanol, 3-amino-1-propanol, and 4-amino-1-butanol are exemplified.

As the aromatic amine and the heterocyclic amine, e.g., aniline derivatives, diphenyl(p-tolyl)amine, methyldiphenylamine, triphenylamine, phenylenediamine, naphthylamine, diaminonaphthalene, pyrrole derivatives, oxazole derivatives, thiazole derivatives, imidazole derivatives, pyrazole derivatives, furazane derivatives, pyrroline derivatives, pyrrolidine derivatives, imidazoline derivatives, imidazolidine derivatives, pyridine derivatives (preferably, 2-(2-hydroxyethyl)pyridine), pyridazine derivatives, pyrimidine derivatives, pyrazine derivatives, pyrazoline derivatives, pyrazolidine derivatives, piperidine derivatives, piperazine derivatives (preferably, 1-(2-hydroxyethyl)piperazine and 1-[2-(2-hydroxyethoxy)ethyl]piperazine), morpholine derivatives (preferably, 4(2-hydroxyethyl)morpholine), indole derivatives, isoindole derivatives, 1H-indazole derivatives, indoline derivatives, quinoline derivatives, isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives can be exemplified.

As acid-decomposable resin (A), resins synthesized by the use of monomer (1) having a structure showing basicity as at least one of copolymerization components, and resins synthesized by the use of compound (2) having a structure showing basicity as a chain transfer agent, are exemplified.

As the repeating units by monomer (1) having a structure showing basicity, e.g., repeating units represented by the following formulae (P1), (P2) and (P3) can be exemplified.

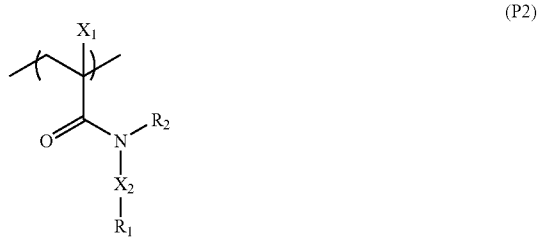

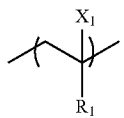
(P3)

In formulae (P1) to (P3), $X_1$ represents a hydrogen atom or an alkyl group; $X_2$ represents a single bond or a divalent linking group; $R_1$ represents a structure showing basicity; $R_2$ represents a hydrogen atom or an alkyl group, and $R_1$ and $R_2$ may be linked to each other to form a ring.

The alkyl group represented by $X_1$ and $R_2$ is preferably an all group having from 1 to 10 carbon atoms, and the alkyl group may be substituted with a fluorine atom, a chlorine atom, a hydroxyl group or the like.

As the examples of the divalent linking group represented by $X_2$, e.g., an alkylene group, an arylene group, an oxy group, and a carbonyl group are exemplified, and these groups may be used alone, or two or more groups may be used in combination.

As the structure showing basicity represented by $R_1$, the above structures can be exemplified.

To further specifically show the repeating unit by monomer (1) having a structure showing basicity, e.g., repeating units represented by the following formulae (P4) to (P10) can be exemplified.

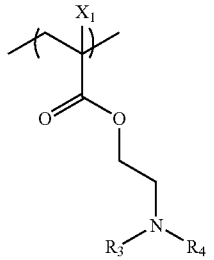
(P4)

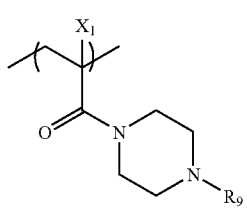
(P5)

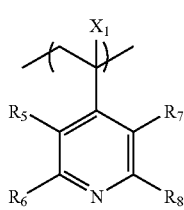
(P6)

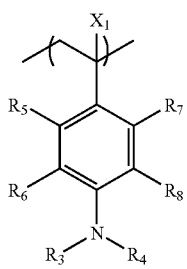
(P7)

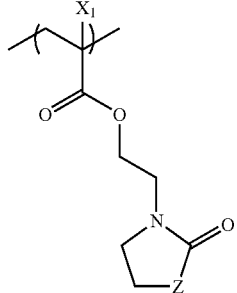
(P8)

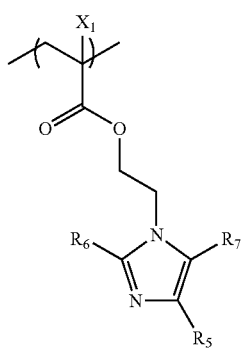
(P9)

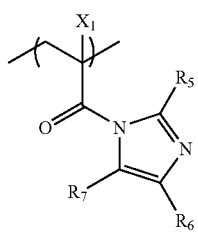
(P10)

In formulae (P4) to (P10), $X_1$ has the same meaning as $X_1$ in formula (P1).

$R_3$ to $R_9$ each independently represents a hydrogen atom, an alkyl group, a cycloalkyl group, an alkenyl group, an aryl group, or an aralkyl group. $R_3$ and $R_4$ may be bonded to each other to form a ring, $R_5$ and $R_6$ and $R_7$ and $R_8$ may be bonded to each other to form a ling (preferably, an aromatic ring). Z represents alkylene or —NH—.

The alkyl group represented by $R_3$ to $R_9$ is preferably an alkyl group having from 1 to 10 carbon atoms, and the alkyl group may be substituted with a fluorine atom, a chlorine atom, a hydroxyl group, a carbonyl group, a cyano group or a sulfone group.

As a repeating unit from the monomer (1) having a structure showing basicity, e.g., compounds represented by the following formulae can be exemplified (In the formula, Rx represents H, $CH_3$ or $CF_3$).

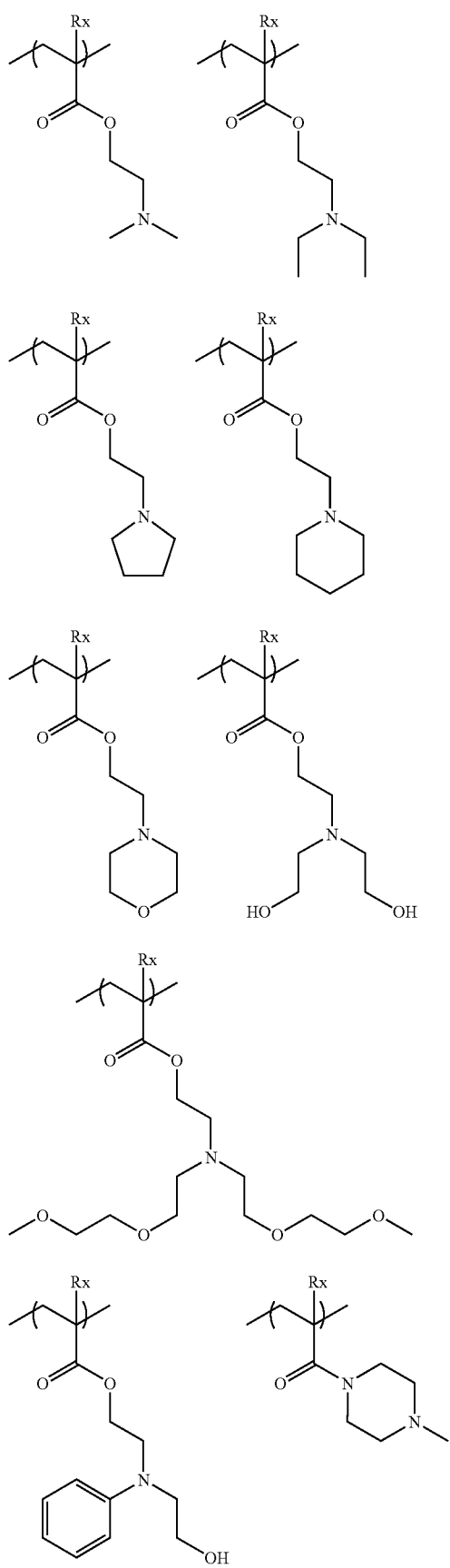
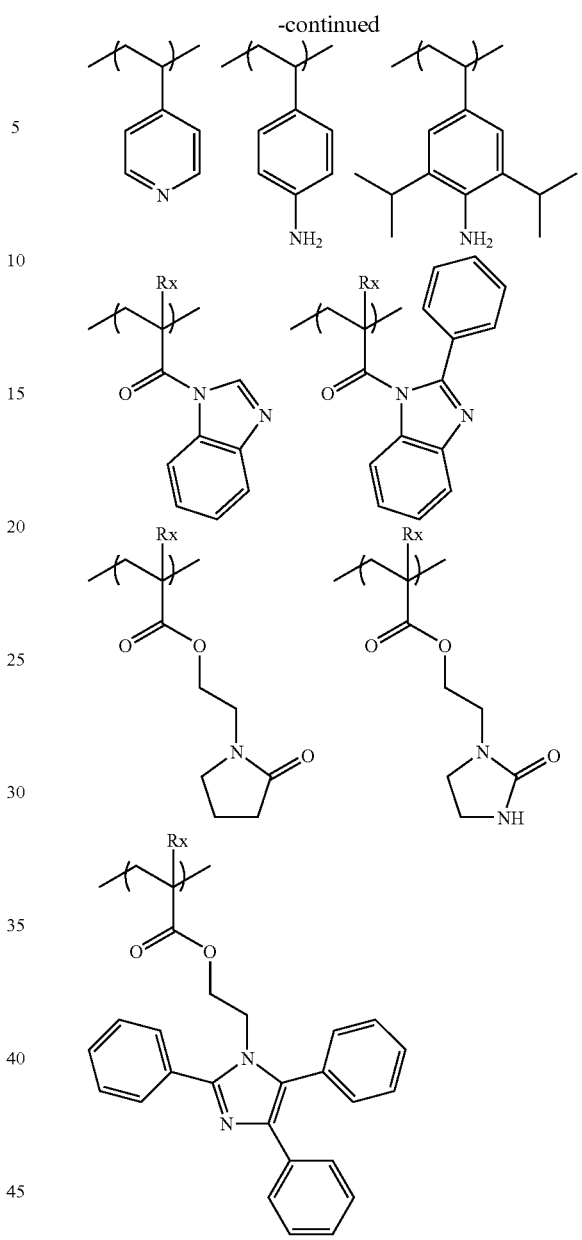

As compound (2) having a structure showing basicity that can be used as a chain transfer agent, e.g., a compound represented by the following formula can be exemplified.

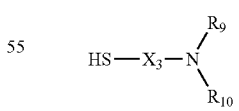

In the above formula, $R_9$ and $R_{10}$ each represents an alkyl group; $X_3$ represents a divalent linking group; $R_9$ and $R_{10}$ may be bonded to each other to form a ring; and $X_3$ and $X_9$ or $X_3$ and $X_{10}$ may be bonded to each other to form a ring.

The alkyl group represented by $R_9$ and $R_{10}$ is preferably an alkyl group having from 1 to 10 carbon atoms, and the alkyl group may be substituted with a fluorine atom, a chlorine atom or a hydroxyl group.

As the examples of the divalent linking group represented by $X_3$, e.g., an alkylene group, an arylene group, an oxy group, and a carbonyl group are exemplified, and these groups may be used alone, or two or more groups may be used in combination.

To further specifically show compound (2) having a structure showing basicity that can be used as a chain transfer agent, e.g., compounds represented by the following formulae can be exemplified,

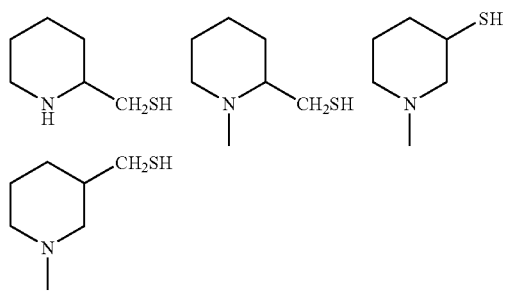

By the use of compound (2) having a structure showing basicity as a chain transfer agent, a structure showing basicity can be introduced into the main chain terminal of acid-decomposable resin (A).

As monomer (1) having a structure showing basicity and compound (2) having a structure showing basicity, commercially available products can be used, or they can also be synthesized by introducing a substituent into an existing basic compound.

Acid-decomposable resin (A) has a repeating unit having a group decomposed by the action of an acid and capable of generating an alkali-soluble group hereinafter sometimes referred to as "acid-decomposable group").

As the alkali-soluble groups, a hydroxyl group, a carboxyl group and a sulfonic acid group are exemplified.

An acid-decomposable group may be introduced to the main chain or the side chain of a resin, or may be introduced to both the main chain and side chain.

A preferred acid-decomposable group is a group obtained by substituting the hydrogen atom of a —COOH group with a group capable of being desorbed by the action of an acid.

As the examples of the acid-decomposable groups, e.g., a cumyl ester group, an enol ester group, an acetal ester group, and a tertiary alkyl ester group are exemplified, and more preferably a tertiary alkyl ester group is exemplified.

As the acid-decomposable groups that acid-decomposable resin (A) may have, —O—C($R_{36}$)($R_{37}$)($R_{38}$), —O—C($R_{36}$)($R_{37}$)(O$R_{39}$), —C(=O)—O—C($R_{36}$)($R_{37}$)($R_{38}$), —C(=O)—O—C($R_{01}$)($R_{02}$)(O$R_{39}$), —O—C($R_{01}$)($R_{02}$)(O$R_{39}$) and —O—C($R_{02}$)($R_{02}$)—C(=O)—O—C($R_{36}$)($R_{37}$)($R_{38}$) can be exemplified.

In the formulae, $R_{36}$, $R_{37}$, $R_{38}$ and $R_{39}$ each represents an alkyl group, a cycloalkyl group, an aryl group, an aralkyl group or an alkenyl group. $R_{36}$ and $R_{37}$, and $R_{36}$ and $R_{39}$ may be bonded to each other to form a ring.

$R_{01}$ and $R_{02}$ each represents a hydrogen atom, an alkyl group, a cycloalkyl group, an aryl group, an aralkyl group or an alkenyl group.

Incidentally, —C($R_{36}$)($R_{37}$)($R_{38}$) means a group that respective groups represented by $R_{36}$, $R_{37}$ and $R_{38}$ are bonded to the carbon atom by a single bond respectively, hereinafter the same.

It is preferred that an acid-decomposable group is a tertiary ester and to have a cyclic aliphatic group, When the positive resist composition in the invention is irradiated with an ArF excimer laser ray, it is preferred for acid-decomposable resin (A) to have a monocyclic or polycyclic alicyclic hydrocarbon structure.

As the repeating unit having a monocyclic or polycyclic alicyclic hydrocarbon structure of acid-decomposable resin (A), a repeating unit having a partial structure containing an alicyclic hydrocarbon represented by any of the following formulae (pI) to (pVI), and a repeating unit represented by the following formula (II-AB) can be exemplified.

The partial structures containing an alicyclic hydrocarbon represented by any of the following formulae (pI) to (pVI) are described in the first place.

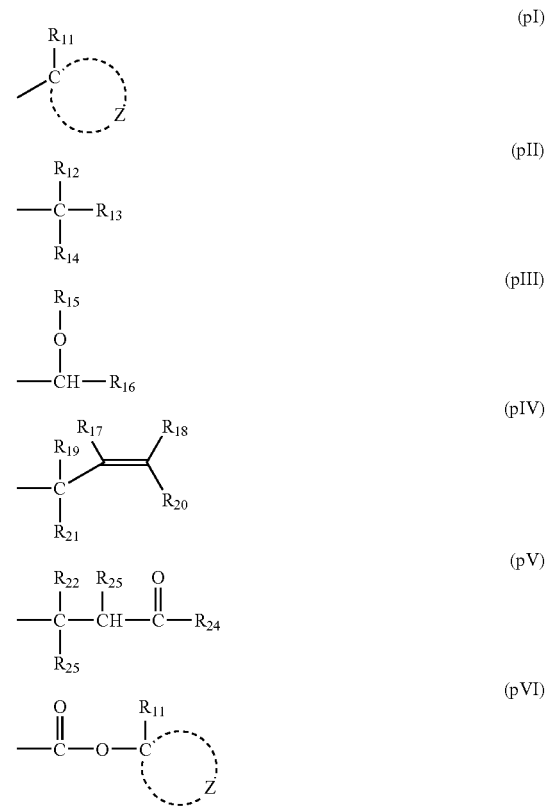

In formulae (pI) to (pVI), $R_{11}$ represents a methyl group, an ethyl group, an n-propyl group, an isopropyl group, an n-butyl group, an isobutyl group, or a sec-butyl group, and Z represents an atomic group necessary to form an alicyclic hydrocarbon group with a carbon atom.

$R_{12}$, $R_{13}$, $R_{14}$, $R_{15}$ and $R_{16}$ each represents a straight chain or branched alkyl group having from 1 to 4 carbon atoms, or an alicyclic hydrocarbon group, provided that at least one of $R_{12}$ to $R_{14}$, or either $R_{15}$ or $R_{16}$ represents an alicyclic hydrocarbon group.

$R_{17}$, $R_{18}$, $R_{19}$, $R_{20}$ and $R_{21}$ each represents a hydrogen atom, a straight chain or branched alkyl group having from 1 to 4 carbon atoms, or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms, or an alicyclic hydrocarbon group.

$R_{22}$, $R_{23}$, $R_{24}$ and $R_{25}$ each represents a hydrogen atom, a straight chain or branched alkyl group having from 1 to 4 carbon atoms, or an alicyclic hydrocarbon group, provided that at least one of $R_{22}$ to $R_{25}$ represents an alicyclic hydrocarbon group, and $R_{23}$ and $R_{24}$ may be bonded to each other to form a ring.

In formulae (pI) to (pVI), the alkyl group represented by $R_{12}$ to $R_{25}$ is a straight chain or branched alkyl group having from 1 to 4 carbon atoms, e.g., a methyl group, an ethyl group, an n-propyl group, an isopropyl group, an n-butyl group, an isobutyl group, a sec-butyl group and a t-butyl group are exemplified.

As the examples of the substituents of the alkyl group, an alkoxyl group having from 1 to 4 carbon atoms, a halogen atom (a fluorine atom, a chlorine ion, a bromine ion, an iodine ion), an acyl group, an acyloxy group, a cyano group, a hydroxyl group, a carboxyl group, an alkoxycarbonyl group, and a nitro group can be exemplified, The alicyclic hydrocarbon groups represented by $R_{11}$ to $R_{25}$ or the alicyclic hydrocarbon group formed by Z and carbon atoms may be monocyclic or polycyclic. Specifically, groups having a monocyclic, bicyclic, tricyclic or tetracyclic structure having 5 or more carbon atoms can be exemplified. The number of carbon atoms is preferably from 6 to 30, and particularly preferably from 7 to 25. These alicyclic hydrocarbon groups may have a substituent.

As preferred alicyclic hydrocarbon groups, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group can be exemplified. The more preferred groups are an adamantyl group, a decalin residue, a norbornyl group, a cedrol group, a cyclohexyl group, a cycloheptyl group, a cyclooctyl group, a cyclodecanyl group and a cyclododecanyl group.

As the substituents of these alicyclic hydrocarbon groups, an alkyl group, a halogen atom, a hydroxyl group, an alkoxyl group, a carboxyl group and an alkoxycarbonyl group can be exemplified As the alkyl group, lower alkyl groups, e.g., a methyl group, an ethyl group, a propyl group, an isopropyl group and a butyl group are preferred, and more preferred alkyl group is selected from the group consisting of a methyl group, an ethyl group, a propyl group and an isopropyl group. As the alkoxyl group, alkoxyl groups having from 1 to 4 carbon atoms, e.g., a methoxy group, an ethoxy group, a propoxy group and a butoxy group can be exemplified. The alkyl group and alkoxyl group may further have a substituent, e.g., a hydroxyl group, a halogen atom and an alkoxyl group can be exemplified as further substituents of the alkyl group and alkoxyl group.

The structures represented by formulae (pI) to (pVI) in the above resin can be used for the protection of alkali-soluble groups. As the alkali-soluble groups, various groups well known in this technical field can be exemplified.

Specifically, as the alkali-soluble groups, a carboxylic acid group, a sulfonic acid group, a phenol group and a thiol group are exemplified, and preferably a carboxylic acid group and a sulfonic acid group.

As the alkali-soluble groups protected with any of the structures represented by formulae (pI) to (pVI) in the resin, structures in which the hydrogen atom of a carboxyl group is substituted with the structures represented by formulae (pI) to (pVI) are preferably exemplified.

For example, a repeating unit represented by the following formula (pA) is preferred.

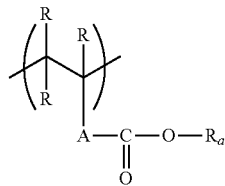

In formula (pA), R represents a hydrogen atom, a halogen atom, or a straight chain or branched alkyl group having from 1 to 4 carbon atoms (as a substituted alkyl group, an alkyl group substituted with a fluorine atom is especially preferred). A plurality of R's may be the same or different.

A represents a single bond, or a single group or a combination of two or more groups selected from the group consisting of an alkylene group, an ether group, a thioether group, a carbonyl group, an ester group, an amido group, a sulfonamido group, a urethane group and a urea group.

Ra represents a group represented by any of formulae (pI) to (pVI).

The repeating unit represented by formula (pA) is more preferably a repeating unit by 2-alkyl-2-adamantyl (meth)acrylate or dialkyl(1-adamantyl)methyl (meth)acrylate.

The specific examples of repeating units having an alicyclic hydrocarbon structure are shown below, but the invention is not limited to these examples.

(In formulae, Rx is H CH$_3$, or CF$_3$.)

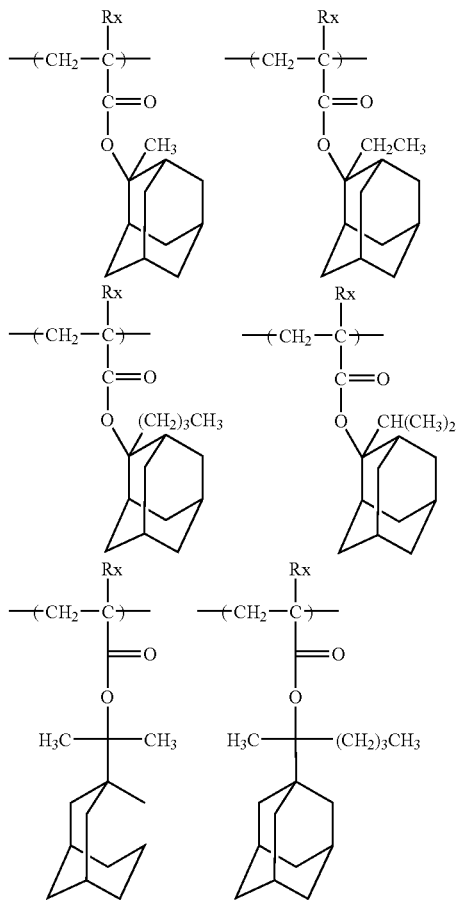

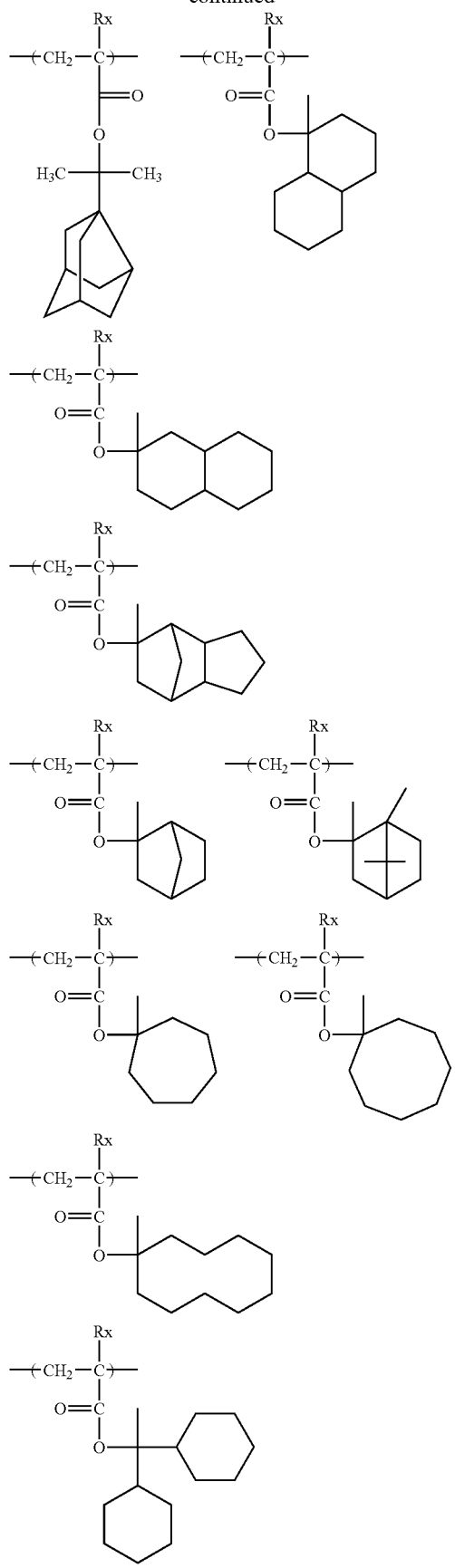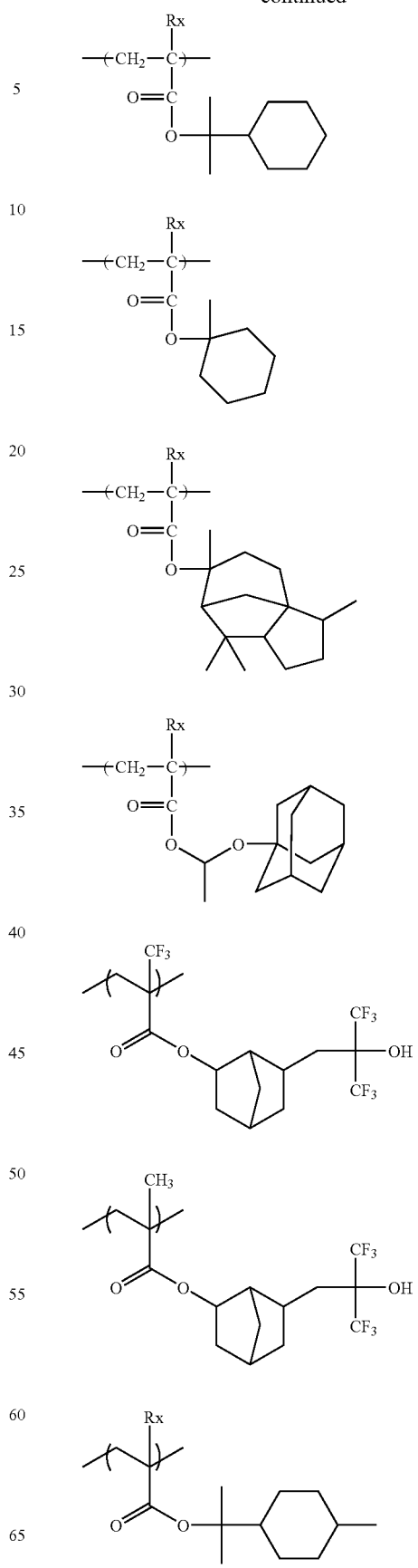

-continued

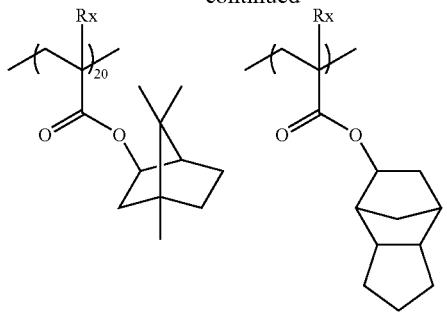

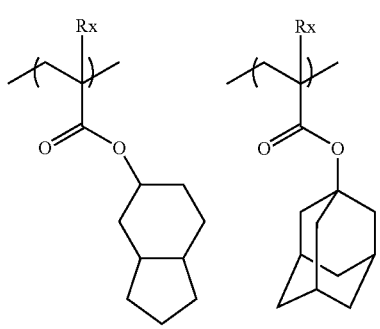

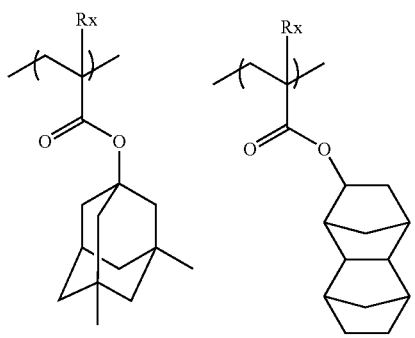

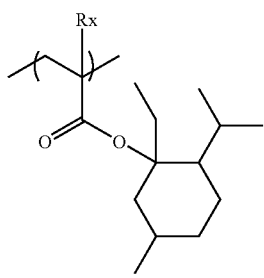

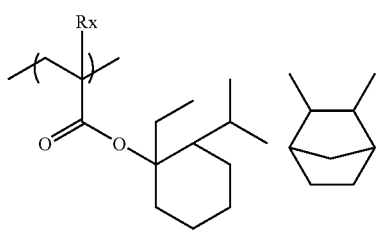

A repeating unit having an alicyclic structure represented by formula (II-AB) is described below.

(II-AB)

In formula (II-AB), $R_{11}'$ and $R_{12}'$ each represents a hydrogen atom, a cyano group, a halogen atom, or an alkyl group; and Z' contains bonded two carbon atoms (C—C) and represents an atomic group to form an alicyclic structure.

A repeating unit represented by formula (II-AB) is more preferably a repeating unit represented by the following formula (II-A) or (II-B).

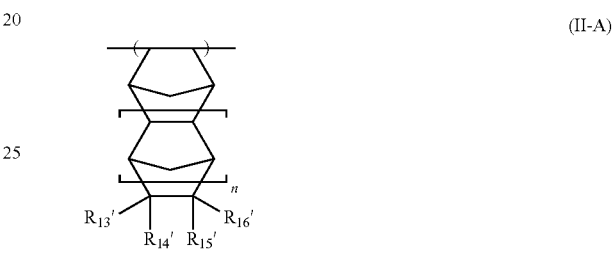
(II-A)

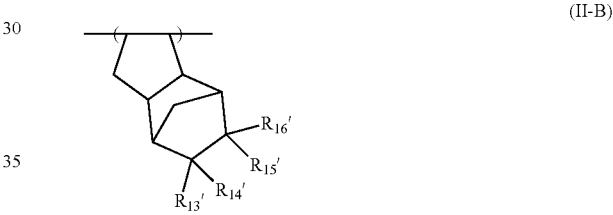
(II-B)

In formulae (II-A) and (II-B), $R_{13}'$, $R_{14}'$, $R_{15}'$ and $R_{16}'$ each represents a hydrogen atom, a halogen atom, a hydroxyl group, a cyano group, —COOH, —COOR$_5$, a group decomposable by the action of an acid, —C(=O)—X-A'-$R_{17}'$, an alkyl group, or a cyclic hydrocarbon group. At least two of $R_{13}'$ to $R_{16}'$ may be bonded to each other to form a ring.

$R_5$ represents an alkyl group, a cyclic hydrocarbon group, or —Y group shown below.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxyl group, —CO—NH—R$_6$, —CO—NH—SO$_2$—R$_6$, or —Y group shown below.

$R_6$ represents an alkyl group or a cyclic hydrocarbon group.

n represents 0 or 1.

—Y group.

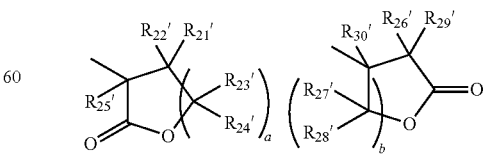

In —Y group, $R_{21}'$ to $R_{30}'$ each represents a hydrogen atom or an alkyl group.

a and b each represents 1 or 2.

As the halogen atom represented by $R_{11}'$ and $R_{12}'$ in formula (II-AB), a chlorine atom, a bromine atom, a fluorine atom and an iodine atom can be exemplified.

The alkyl group represented by $R_{11}'$ and $R_{12}'$ is preferably a straight chain or branched alkyl group having from 1 to 10 carbon atoms, more preferably a straight chain or branched alkyl groups having from 1 to 6 carbon atoms, and still more preferably a methyl group, an ethyl group, a propyl group, an isopropyl group, an n-butyl group, an isobutyl group, a sec-butyl group or a t-butyl group.

As further substituents of the alkyl group, a hydroxyl group, a halogen atom, a carboxyl group, an alkoxyl group, an acyl group, a cyano group and an acyloxy group can be exemplified. As the halogen atoms, a chlorine atom, a bromine atom, a fluorine atom, and an iodine atom can be exemplified, as the alkoxyl group, an alkoxyl group having from 1 to 4 carbon atoms, e.g., a methoxy group, an ethoxy group, a propoxy group and a butoxy group can be exemplified, as the acyl group, e.g., a formyl group and an acetyl group can be exemplified, and as the acyloxy group, an acetoxy group can be exemplified.

The atomic group represented by Z' to form an alicyclic structure is an atomic group to form a repeating unit of alicyclic hydrocarbon, which may have a substituent, in a resin, and an atomic group to form a crosslinking alicyclic structure forming a crosslinking alicyclic hydrocarbon repeating unit is especially preferred.

As the skeleton of the alicyclic hydrocarbon formed, the same alicyclic hydrocarbon groups as the alicyclic hydrocarbon groups represented by $R_{12}$ to $R_{25}$ in formulae pI) to (pVI) are exemplified.

The skeleton of the alicyclic hydrocarbon may have a substituent, and the groups represented by $R_{13}'$ to $R_{16}'$ in formula (II-A) or (II-B) can be exemplified as the substituents.

Of the repeating units having crosslinking alicyclic hydrocarbon, the repeating units represented by formula (II-A) or (II-B) are more preferred.

In the repeating units represented by formulae (II-AB), (II-A) and (II-B), the acid-decomposable group may be contained in —C(=O)—X-A'-$R_{17}'$, or may be contained as the substituent of the alicyclic structure formed by Z'.

The structure of the acid-decomposable group is represented by formula —C(=O)—$X_1$—$R_0$.

In the formula, $R_0$ represents a tertiary alkyl group, e.g., a t-butyl group or a t-amyl group; an isoboronyl group; a 1-alkoxyethyl group, e.g., a 1-ethoxyethyl group, a 1-butoxyethyl group, a 1-isobutoxyethyl group, or a 1-cyclohexyloxyethyl group, an alkoxymethyl group, e.g., a 1-methoxymethyl group or a 1-ethoxymethyl group; a 3-oxoalkyl group, a tetrahydropyranyl group, a tetrahydrofuranyl group, a trialkylsilyl ester group, a 3-oxocyclohexyl ester group, a 2-methyl-2-adamantyl group, or a mevalonic lactone residue. $X_1$ has the same meaning as X above.

As the halogen atoms represented by $R_{13}'$, $R_{14}'$, $R_{15}'$ and $R_{16}'$ in formulae (II-A) and (II-B), a chlorine atom, a bromine atom, a fluorine atom and an iodine atom can be exemplified.

The alkyl groups represented by $R_{13}'$ to $R_{16}'$, $R_5$, $R_6$, $R_{21}'$ to $R_{30}'$ are preferably straight chain or branched alkyl groups having from 1 to 10 carbon atoms, more preferably straight chain or branched alkyl groups having from 1 to 6 carbon atoms, and still more preferably a methyl group, an ethyl group, a propyl group, an isopropyl group, an n-butyl group, an isobutyl group, a sec-butyl group and t-butyl.

The cyclic hydrocarbon groups represented by $R_{13}'$ to $R_{16}'$ $R_5$ and $R_6$ are, e.g., cyclic cycloalkyl groups and crosslinking hydrocarbons, and a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornanepoxy group, a menthyl group, an isomenthyl group, a neomenthyl group, and a tetracyclododecanyl group can be exemplified.

As the rings formed by the bonding of at least two of $R_{13}'$ and $R_{16}'$, rings having from 5 to 12 carbon atoms, e.g., cyclopentene, cyclohexene, cycloheptane and cyclooctane can be exemplified.

As the alkoxyl group represented by $R_{17}'$, an alkoxyl group having from 1 to 4 carbon atoms, e.g., a methoxy group, an ethoxy group, a propoxy group and a butoxy group can be exemplified.

As further substituents of the alkyl, cyclic hydrocarbon and alkoxyl groups, a hydroxyl group, a halogen atom, a carboxyl group, an alkoxyl group, an acyl group, a cyano group, an acyloxy group, an alkyl group, and a cyclic hydrocarbon group can be exemplified. As the halogen atoms, a chlorine atom, a bromine atom, a fluorine atom and an iodine atom can be exemplified, as the alkoxyl groups, alkoxyl groups having from 1 to 4 carbon atoms, e.g., a methoxy group, an ethoxy group, a propoxy group and a butoxy group can be exemplified, as the acyl groups, e.g., a formyl group and an acetyl group can be exemplified, and as the acyloxy group, an acetoxy group can be exemplified.

As the alkyl groups and cyclic hydrocarbon groups, the same groups as those described above can be exemplified.

As the divalent linking group represented by A', a single group or combinations comprising two or more groups selected from the group consisting of an alkylene group, an ether group, a thioether group, a carbonyl group, an ester group, an amido group, a sulfonamido group, a urethane group and a urea group can be exemplified.

Various substituents of $R_{13}'$ to $R_{16}'$ in formula (II-A) or (II-B) can also be used as the substituents of the atomic group to form an alicyclic structure in formula (II-AB), or atomic group Z to form a crosslinking alicyclic structure.

The specific examples of the repeating units represented by formula (II-A) or (II-B) are shown below, but the invention is not limited to these specific examples.

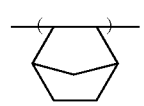

[II-1]

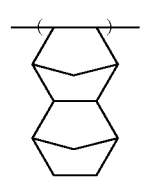

[II-2]

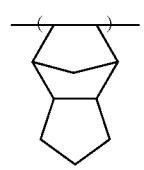

[II-3]

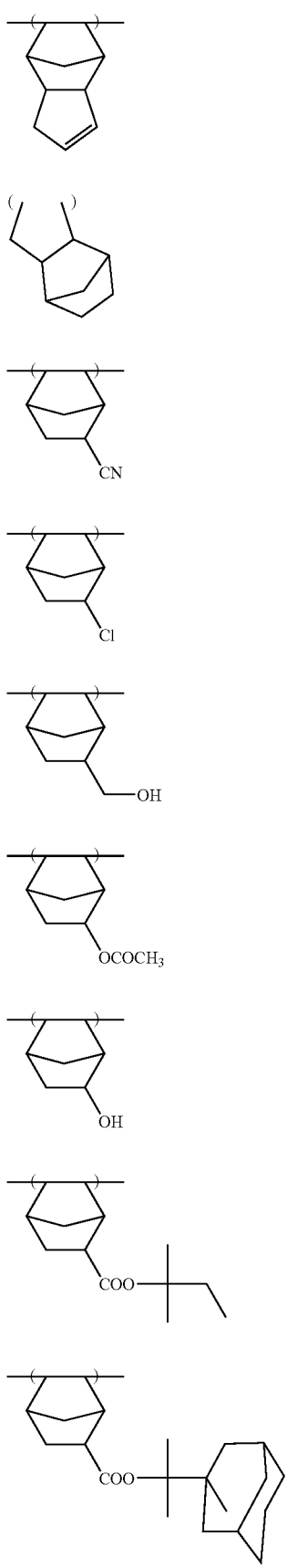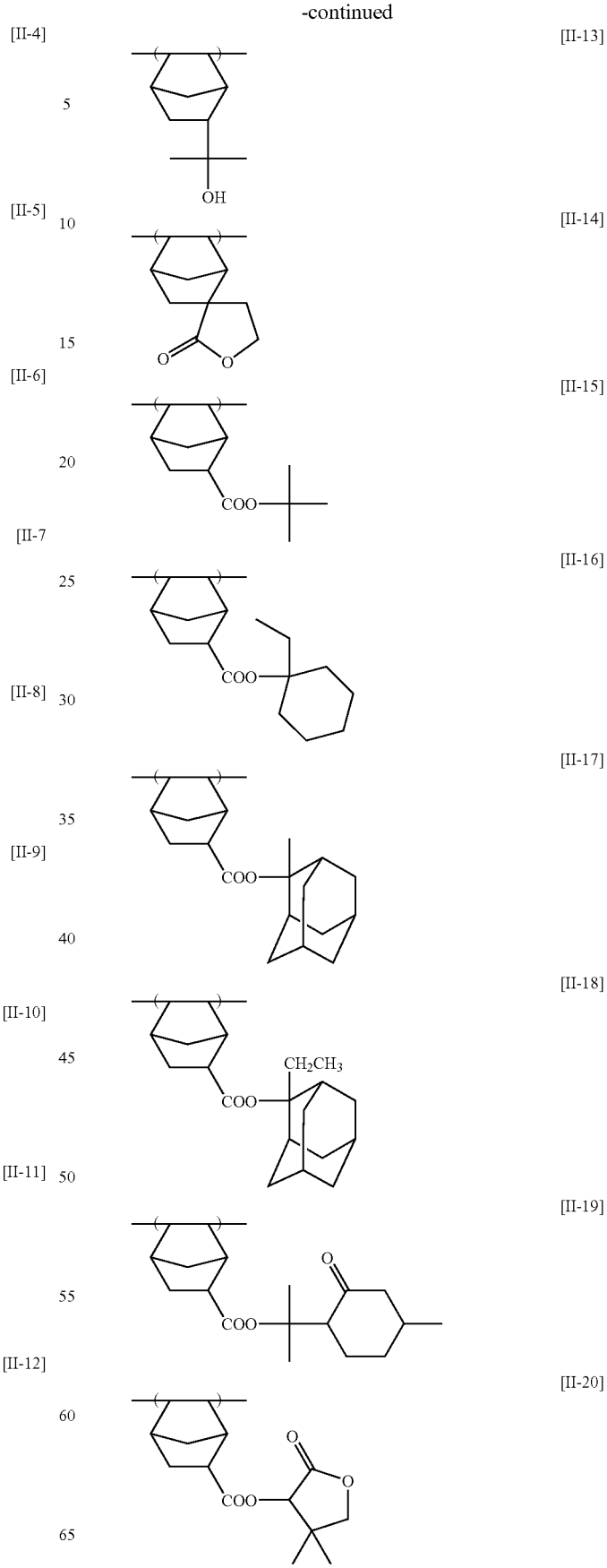

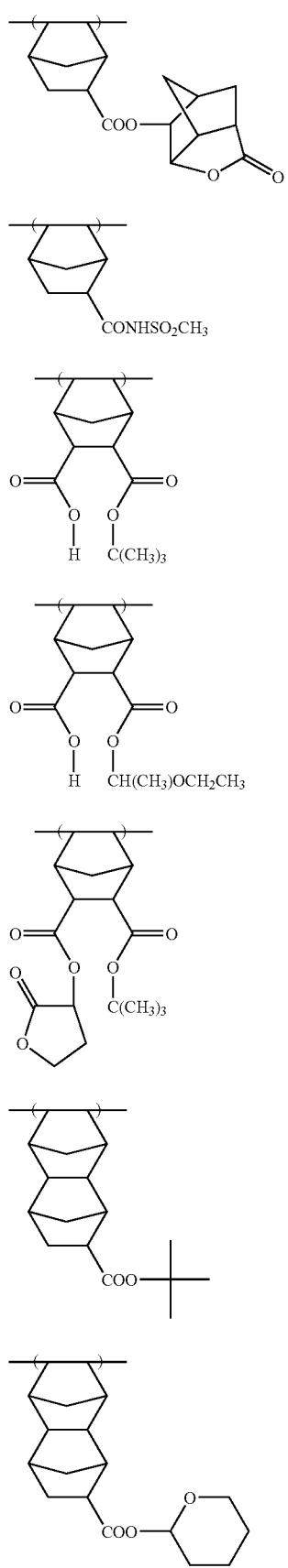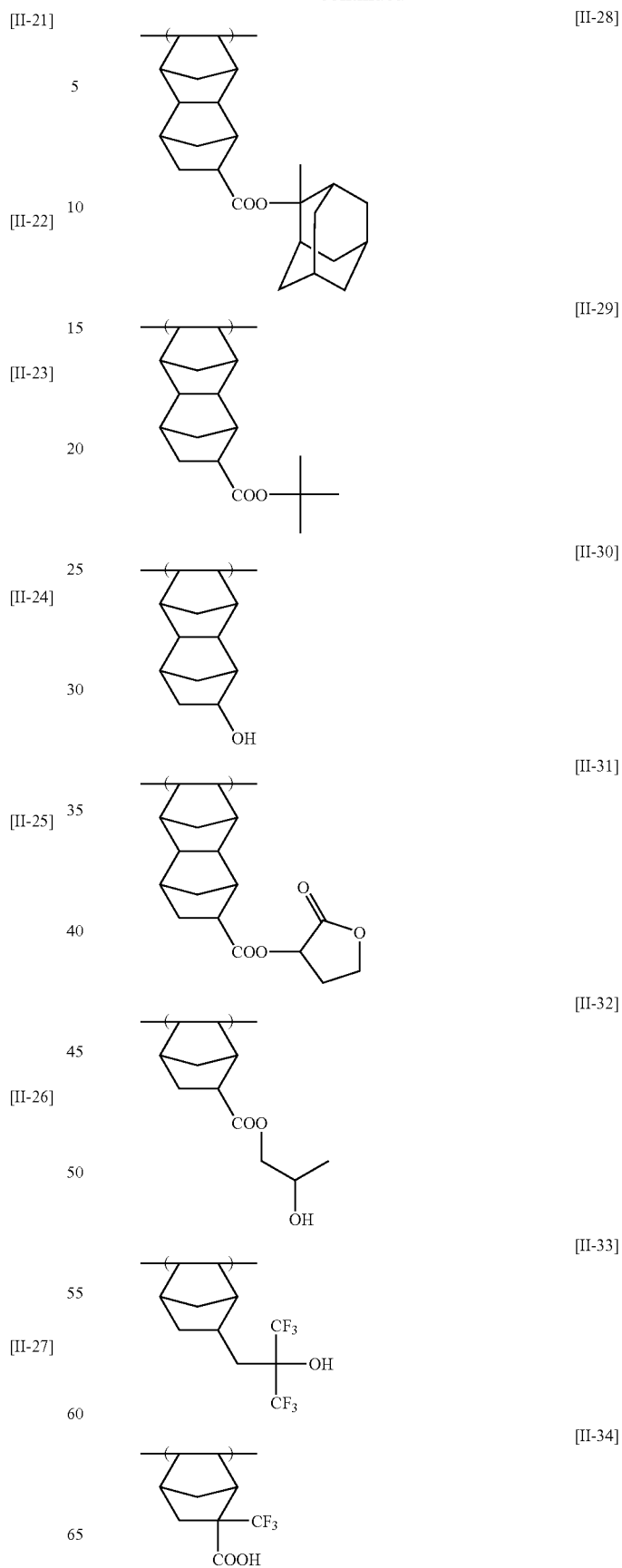

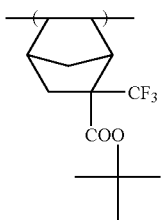

In acid-decomposable resin (A), an acid-decomposable group may be contained in any of a repeating unit having a partial structure containing alicyclic hydrocarbon represented by any of formulae (pI) to (pVI), a repeating unit represented by formula (II-AB), and the later-described repeating unit of other copolymerizable components.

It is preferred for acid-decomposable resin (A) to have a lactone group, more preferably to have a repeating unit having a group having a lactone structure represented by the following formula (Lc) or any of formulae (III-1) to (III-5). The group having a lactone structure may be directly bonded to the main chain.

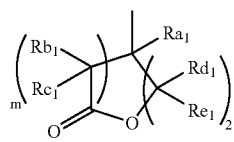 (Lc)

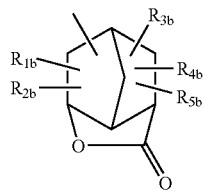 (III-1)

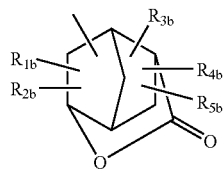 (III-2)

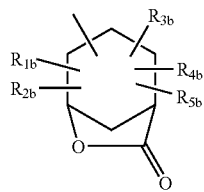 (III-3)

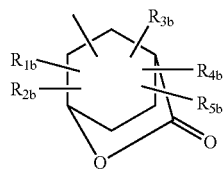 (III-4)

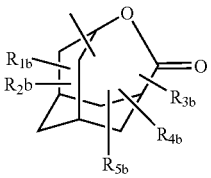 (III-5)

In formula (Lc), $Ra_1$, $Rb_1$, $Rc_1$, $Rd_1$ and $Re_1$ each represents a hydrogen atom or an alkyl group; m and n each represents an integer of from 0 to 3, and m+n is from 2 to 6.

In formulae (III-1) to (III-5), $R_{1b}$, $R_{2b}$, $R_{3b}$, $R_{4b}$ and $R_{5b}$ each represents a hydrogen atom, an alkyl group, a cycloalkyl group, an alkoxyl group, an alkoxycarbonyl group, an alkylsulfonylamino group or an alkenyl group. Two of $R_{1b}$ to $R_{5b}$ may be bonded to form a ring.

As the alkyl groups represented by $Ra_1$ to $Re_1$ in formula (Lc), and the alkyl groups in the alkyl groups, alkoxyl groups, alkoxycarbonyl groups and alkylsulfonylamino groups represented by $R_{1b}$ to $R_{5b}$ in formulae (III-1) to (III-5), straight chain or branched alkyl groups are exemplified, and these alkyl groups may have a substituent.

As preferred substituents, an alkoxyl group having from 1 to 4 carbon atoms, a halogen atom (a fluorine atom, a chlorine atom, a bromine atom, an iodine atom), an acyl group having from 2 to 5 carbon atoms, an acyloxy group having from 2 to 5 carbon atoms, a cyano group, a hydroxyl group, a carboxyl group, an alkoxycarbonyl group having from 2 to 5 carbon atoms, and a nitro group can be exemplified.

As the repeating units having a group having a lactone structure represented by formula (Lc) or any of formulae (III-1) to (III-5), a repeating unit represented by formula (II-A) or (II-B) in which at least one of $R_{13}'$ to $R_{16}'$ has a group represented by formula (Lc) or any of formulae (III-1) to (III-5) (for example, $R_5$ in —$COOR_5$ represents a group represented by formula (Lc) or any of formulae (III-1) to (III-5)), or a repeating unit represented by the following formula (AI) can be exemplified.

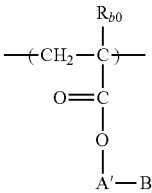 (AI)

In formula (AI), $R_{b0}$ represents a hydrogen atom, a halogen atom, or an alkyl group having from 1 to 4 carbon atoms. The alkyl group represented by $R_{b0}$ may have a substituent, and as the substituents, the groups described above as the preferred substituents of the alkyl group represented by $R_{1b}$ in formulae (III-1) to (III-5) are exemplified.

As the halogen atom represented by $R_{b0}$, a fluorine atom, a chlorine atom, a bromine atom and an iodine atom can be exemplified. $R_{b0}$ preferably represents a hydrogen atom.

A' represents a single bond, an ether group, an ester group, a carbonyl group, an alkylene group, or a divalent linking group combining these groups.

$B_2$ represents a group represented by formula (Lc) or any of formulae (III-1) to (III-5).

The specific examples of repeating units having a group having a lactone structure are shown below, but the invention is not limited thereto
(In formulae, Rx represents $CH_3$ or $CF_3$.)
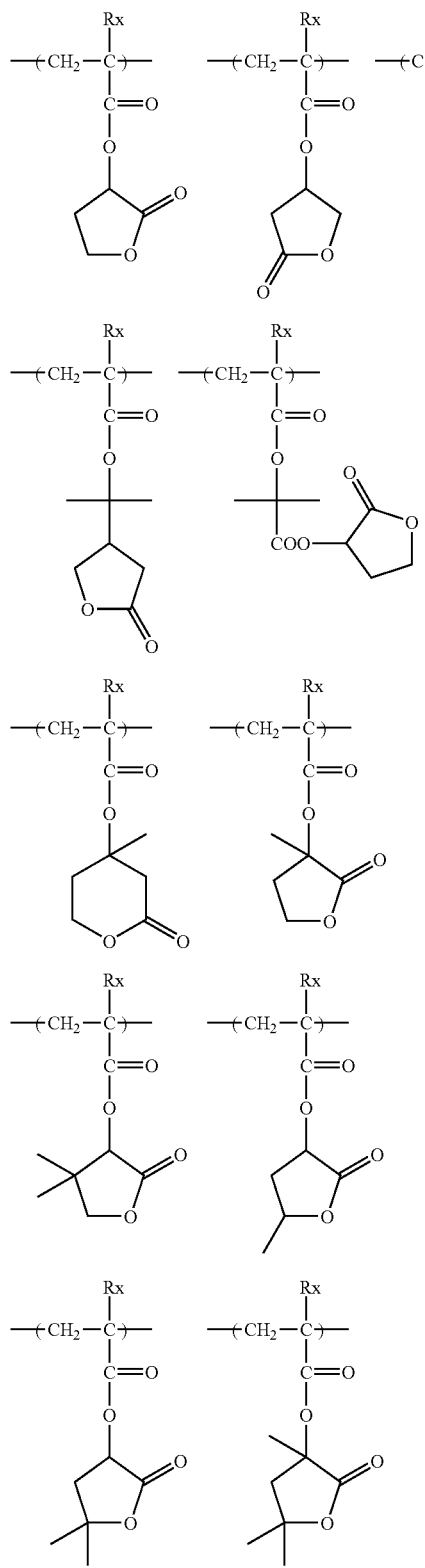
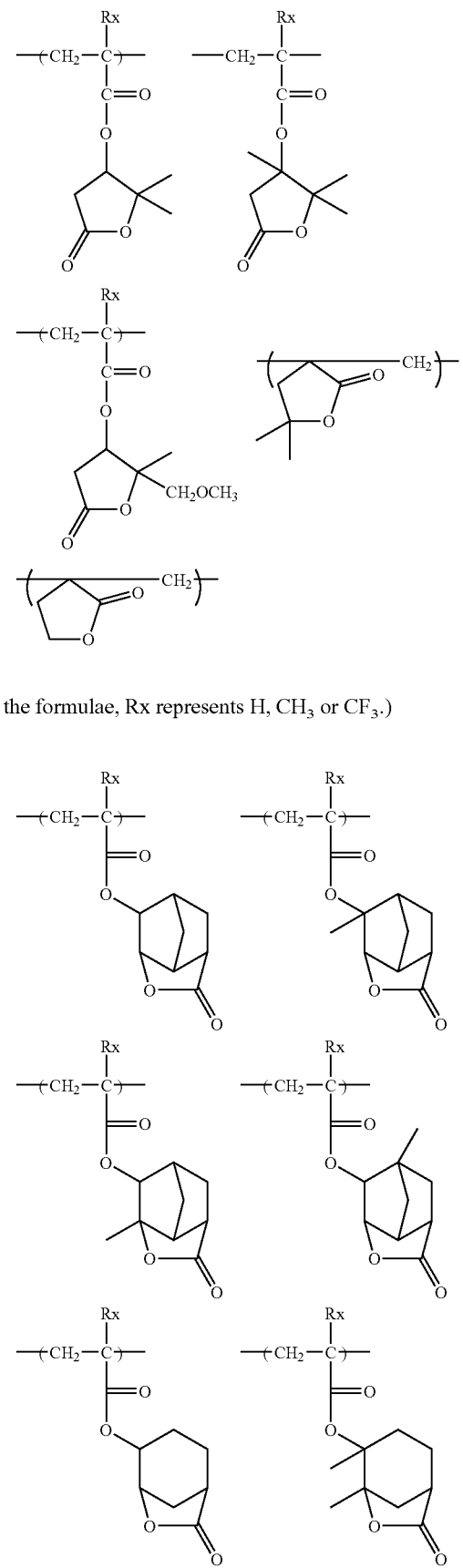
(In the formulae, Rx represents H, $CH_3$ or $CF_3$.)

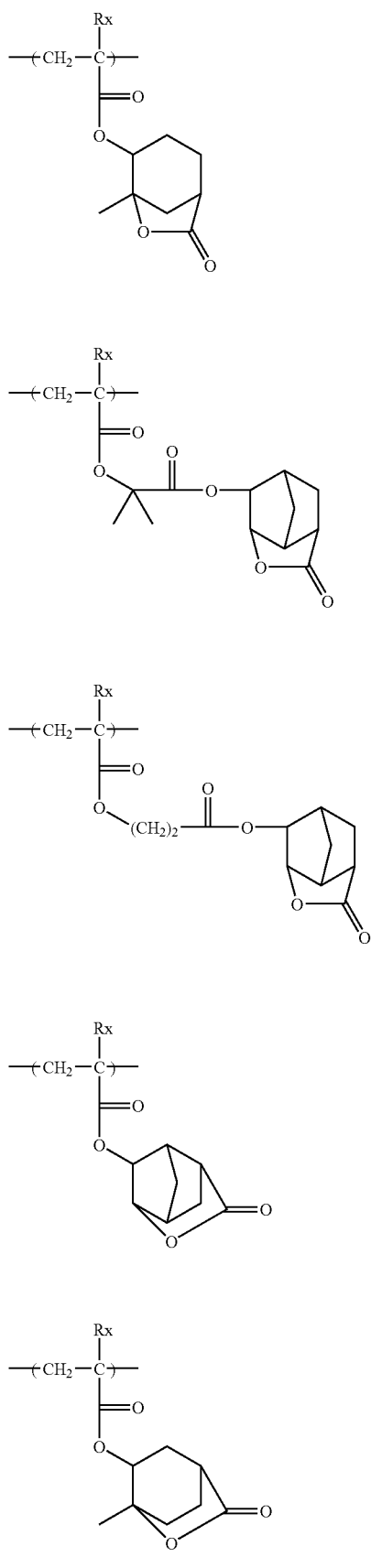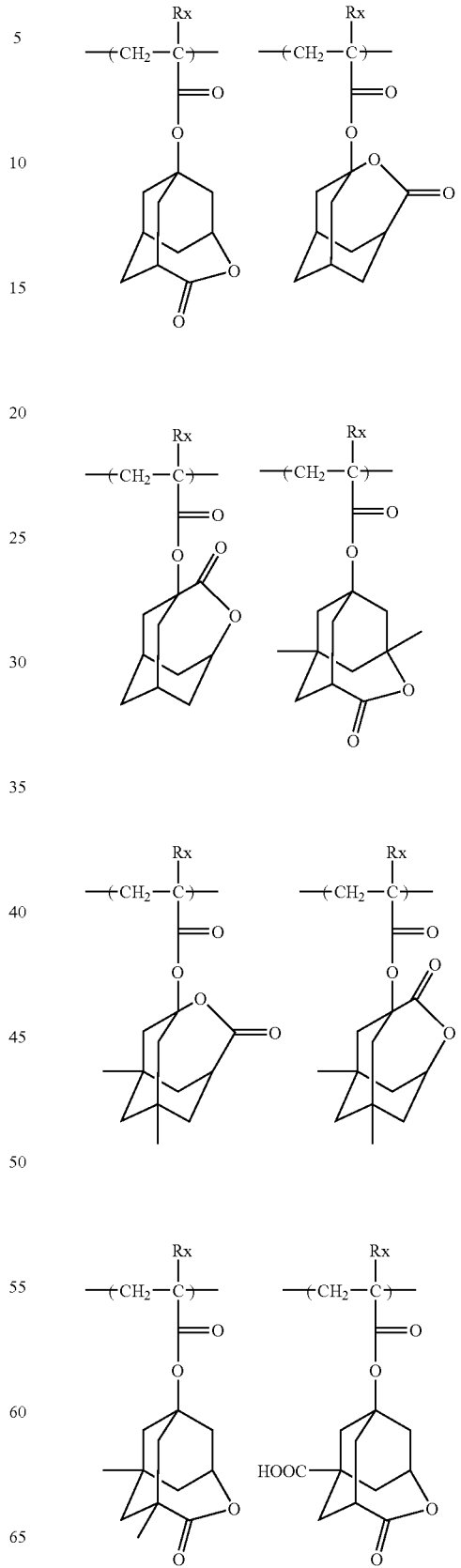
(In the formulae, Rx represents H, CH₃ or CF₃.)

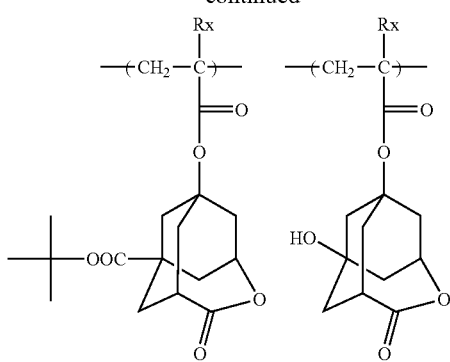
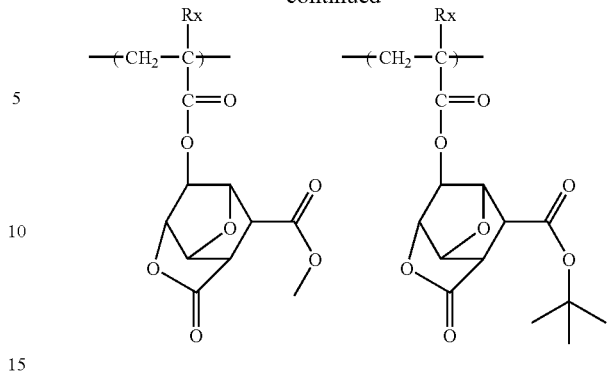

Acid-decomposable resin (A) may contain a repeating unit having a group represented by the following formula (IV).

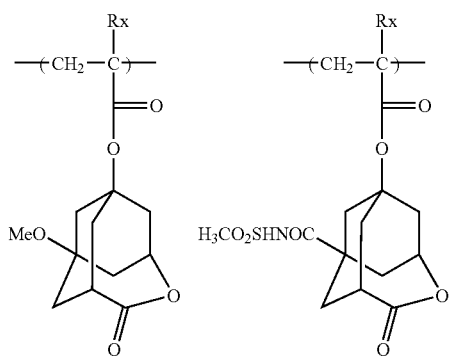

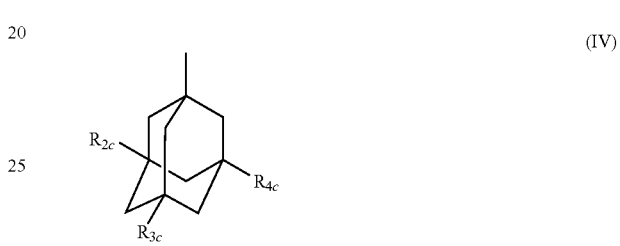

(IV)

In formula (IV), $R_{2c}$, $R_{3c}$, and $R_{4c}$ each represents a hydrogen atom or a hydroxyl group, provided that at least one of $R_{2c}$, $R_{3c}$ and $R_{4c}$ represents a hydroxyl group The group represented by formula (IV) is preferably a dihydroxy body or a monohydroxy body, more preferably a dihydroxy body.

As the repeating unit having a group represented by formula (IV), a repeating unit represented by formula (II-A) or (II-B) in which at least one of $R_{13}'$ to $R_{16}'$ has a group represented by formula (IV) (for example, $R_5$ in —COOR$_5$ represents a group represented by formula (IV)), or a repeating unit represented by the following formula (AII) can be exemplified.

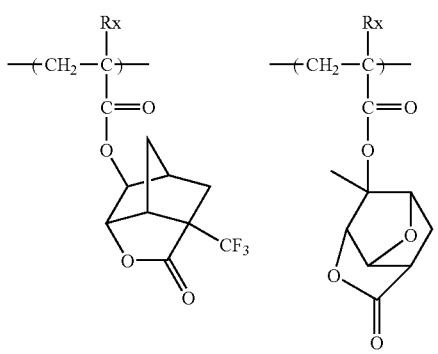

(AII)

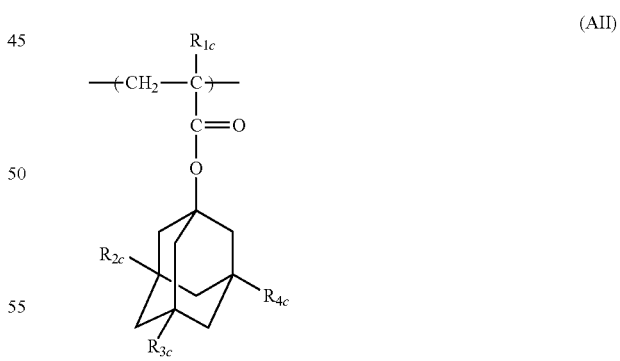

In formula (AII), $R_{1c}$ represents a hydrogen atom or a methyl group.

$R_{2c}$, $R_{3c}$ and $R_{4c}$ each represents a hydrogen atom or a hydroxyl group, provided that at least one of $R_{2c}$, $R_{3c}$ and $R_{4c}$ represents a hydroxyl group. It is preferred that two of $R_{2c}$, $R_{3c}$ and $R_{4c}$ represent a hydroxyl group.

The specific examples of the repeating units having a structure represented by formula (AII) are shown below, but the invention is not limited thereto.

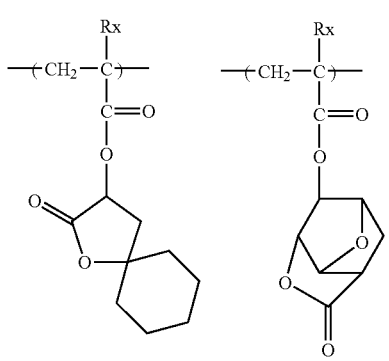

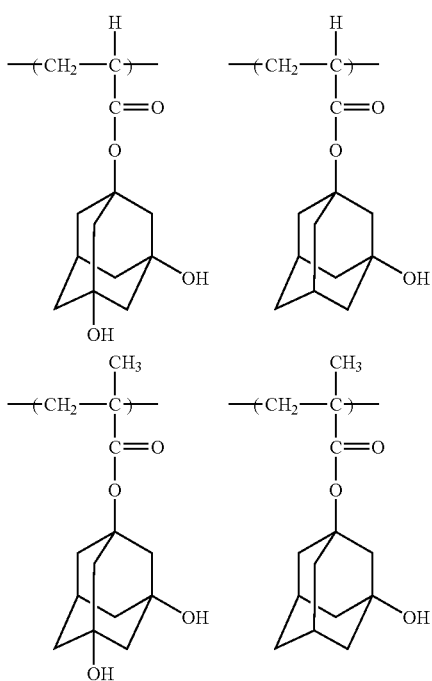

Acid-decomposable resin (A) may contain a repeating unit represented by the following formula (V).

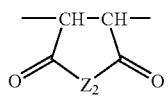  (V)

In formula (V), $Z_2$ represents —O— or —N($R_{41}$)—; $R_{41}$ represents a hydrogen atom, a hydroxyl group, an alkyl group, or —OSO$_2$—$R_{42}$; and $R_{42}$ represents an alkyl group, a cycloalkyl group, or a camphor residue. The alkyl group, the cycloalkyl group and the camphor residue represented by $R_{41}$ and $R_{42}$ may be substituted with a halogen atom (preferably a fluorine atom), etc.

As the repeating units represented by formula (V), the following specific examples are exemplified, but the invention is not limited thereto.

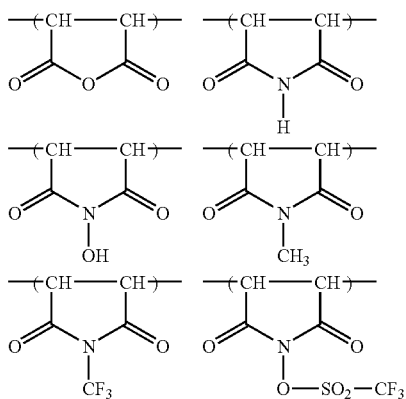

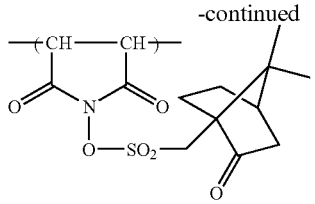

It is preferred that acid-decomposable resin (A) comprises a (meth)acrylic repeating unit alone.

Acid-decomposable resin (A) may contain various repeating structural units besides the above repeating units for the purpose of adjusting dry etching resistance, an aptitude for standard developing solutions, adhesion to substrates, resist profile, and in addition to these, general requisite characteristics of resists, e.g., resolution, heat resistance and sensitivity.

As these repeating structural units, the repeating structural units corresponding to monomers shown below can be exemplified, but the invention is not restricted thereto.

By containing various kinds of repeating structural units, fine adjustment of performances required of acid-decomposable resin (A), in particular fine adjustment of the following performances becomes possible, that is, (1) Solubility in a coating solvent,
(2) A film-forming property (a glass transition point),
(3) Alkali developability,
(4) Decrease of layer thickness (hydrophobic-hydrophilic property, the selection of an alkali-soluble group),
(5) Adhesion of an unexposed area to a substrate, and
(6) Dry etching resistance.

The examples of such monomers include compounds having one addition polymerizable unsaturated bond selected from acrylic esters, methacrylic esters, acrylamides, methacryl-amides, allyl compounds, vinyl ethers and vinyl esters.

In addition to the aforementioned compounds, addition polymerizable unsaturated compounds copolymerizable with the monomers corresponding to the above various repeating structural units may be used for copolymerization.

In acid-decomposable resin (A), the molar ratio of the content of each repeating structural unit is arbitrarily selected to adjust dry etching resistance, an aptitude for a standard developing solution, adhesion to a substrate, and resist profile, in addition to these, to adjust general requisite characteristics of resists, e.g., resolution, heat resistance and sensitivity.

The preferred embodiments of acid-decomposable resin (A) include the following.

(1) Resins containing a repeating unit having a partial structure containing the alicyclic hydrocarbon represented by any of formulae (pI) to (pVI) (a side chain type).
(2) Resins having a repeating unit represented by formula (II-AB) (a main chain type), and the following embodiment is further exemplified in (2).
(3) Resins having a repeating unit represented by formula (II-AB), a maleic anhydride derivative and a (meth)acrylate structure (a hybrid type).

The content of a repeating unit having a structure showing basicity in acid-decomposable resin (A) is preferably from 0.01 to 5 mol % in all the repeating structural units, more preferably from 0.1 to 5 mol %, and still more preferably from 0.1 to 1 mol %.

The content of a repeating unit having an acid-decomposable group in acid-decomposable resin (A) is preferably from 10 to 70 mol % in all the repeating structural units, more preferably from 20 to 65 mol %, and still more preferably from 25 to 50 mol %.

The content of a repeating unit having an alicyclic hydrocarbon structure represented by any of formulae (pI) to (pVI) or formula (II-AB) in acid-decomposable resin (A) is preferably from 20 to 70 mol % in all the repeating structural units, more preferably from 24 to 65 mol %, and still more preferably from 28 to 60 mol %.

The content of repeating structural units in the resin on the basis of the monomers of the further copolymerization components can also be optionally set according to desired resist performances, and the content thereof is generally preferably 99 mol % or less based on the total mol number of a repeating structural unit having a partial structure containing alicyclic hydrocarbon represented by any of formulae (pI) to (pVI) and a repeating unit represented by formula (II-AB), more preferably 90 mol % or less, and still more preferably 80 mol % or less.

The contents of a repeating unit having a group having the above lactone structure and a repeating unit having the group represented by formula (IV) (a hydroxyadamantane structure) are as follows:

Based on the total mol number of a repeating structural unit having a partial structure containing alicyclic hydrocarbon represented by any of formulae (pI) to (pVI) and a repeating unit represented by formula (II-AB), the content of a repeating unit having a group having the lactone structure is preferably from 1 to 70 mol %, and more preferably from 10 to 70 mol %, and the content of a repeating unit having the group represented by formula (IV) is preferably from 1 to 70 mol %, and more preferably from 1 to 50 mol %.

When the resist composition in the invention is a composition for ArF exposure, it is preferred that the resin should not contain an aromatic group from the point of the transparency to ArF rays.

Acid-decomposable resin (A) in the invention can be synthesized according to ordinary methods (e.g., radical polymerization). For example, as ordinary methods, a monomer seed is put in a reaction vessel at a time or in parts during the course of the reaction, and according to necessity the monomer is dissolved in a reaction solvent capable of dissolving the composition of the invention such as ethers, e.g., tetrahydrofuran or 1,4-dioxane, ketones, e.g., methyl ethyl ketone or methyl isobutyl ketone, or the later-described solvents, e.g., propylene glycol monomethyl ether acetate, to make the monomer homogeneous. The solution is then heated, if necessary, under the inert gas atmosphere such as nitrogen or argon, and polymerization is initiated with a commercially available radical polymerization initiator (e.g., azo initiators, peroxide and the like). If necessary, the initiator is further added at a time or in parts, and after completion of the reaction, the reaction product is put in a solvent, and a desired polymer is recovered as powder or solid. The reaction concentration is 20 mass % or more, preferably 30 mass % or more, and more preferably 40 mass % or more. The reaction temperature is generally from 10 to 150° C., preferably from 30 to 120° C., and more preferably from 50 to 110° C.

Incidentally, when compound (2) having a structure showing basicity is used as a chain transfer agent, compound (2) may be used with a radical polymerization initiator. At that time, the use proportion of compound (2) is preferably from 0.1 to 3 mol %.

Further, the resin in the invention is preferably an alicyclic hydrocarbon series acid-decomposable resin obtained by the polymerization of a monomer having a Log P value of from 0 to 5. Log P value is a value indicated by Log (a distribution coefficient of (octanol/water)), which is a parameter showing solubility The smaller the value, the more hydrophilic is the resin, and the greater the value, the more hydrophobic is the resin.

The difference in a refractive index between the resin of the invention and an immersion liquid is preferably smaller. In particular, when an exposure light source is 193 nm, a refractive index of from 1.4 to 2.0 is preferred. A refractive index can be measured according to multi-incident angle spectral ellipsometry.

These repeating structural units may be used alone, or a plurality of repeating units may be used as mixture. In the invention, resins may be used alone, or a plurality of resins may be used in combination.

The weight average molecular weight of acid-decomposable resin (A) is preferably from 1,000 to 200,000 in polystyrene equivalent by the GPC (gas permeation chromatography) method, and more preferably from 3,000 to 20,000. By bringing the weight average molecular weight to 1,000 or more, heat resistance and dry etching resistance can be improved. When the weight average molecular weight is 200,000 or less, developing property can be increased and film-forming property can be improved for low viscosity.

The molecular weight distribution (Mw/Mn, also referred to as the degree of dispersion) of acid-decomposable resin (A) is generally from 1 to 5, preferably from 1 to 4, and more preferably from 1 to 3. In view of resolution, resist shape, the sidewall of the resist pattern, and a roughness property, the molecular weight distribution of the resin is preferably 5 or lower.

The amount of a residual monomer in resin (A) is preferably 2 mass % or less in the points of profile and line edge roughness. The residual monomer means a monomer that is not polymerized and remains in resin (A) in the synthesis of resin (A). The amount of a residual monomer in resin (A) is preferably 2 mass % or less, more preferably 1 mass % or less, and still more preferably 0.5 mass % or less. A residual monomer can be removed by the purification of a resin in a synthesis process repeatedly, preferably from 3 to 10 times.

The blending amount of acid-decomposable resin (A) in the positive resist composition in the invention is preferably from 40 to 99.99 mass % in the total solids content, and more preferably from 50 to 99.97 mass %.

(B) Compound Capable of Generating an Acid Upon Irradiation with an Actinic Ray or Radiation The compound that generates an acid upon irradiation with an actinic ray or radiation to be used for the positive resist composition according to the invention (hereinafter sometimes referred to as "acid generator") is to be described below.

The acid generator used in the invention can be selected from the compounds used generally as the acid generator.

That is, photoinitiator for photo-cationic polymerization, photoinitiator for photo-radical polymerization, light extinguishing agent for dyes, light discolorant, or known compounds capable of generating an acid upon irradiation with an actinic ray or radiation such as far UV-rays and X-rays used for microresist or the like, as well as mixtures thereof can be properly selected and used.

They include, for example, diazonium salt, phosphonium salt, sulfonium salt, iodonium salt, imidosulfonate, oximesulfonate, diazodisulfone, disulfone and o-nitrobenzylsulfonate.

For compounds in which the group or the compound capable of generating an acid upon irradiation with an actinic ray or radiation are introduced to the main chain or the side chains of the polymer, for example, compounds described in U.S. Pat. No. 3,849,137, GP No. 3914407, JP-A Nos. 63-26653, 55-164824, 62-69263, 63-146038, 63-163452, 62-153853, and 63-146029 can be used.

In addition, compounds generating an acid by light described in U.S. Pat. No. 3,779,778 and EP No. 126,712 can also be used.

Preferred compounds, among the acid generators, include compounds represented by the following general formulae (ZI), (ZII) and (ZIII).

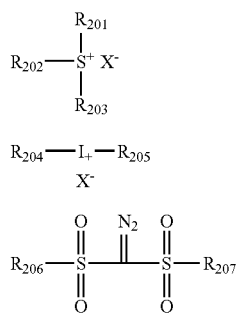

In the general formula (ZI), $R_{201}$, $R_{202}$ and $R_{203}$ each independently represents an organic group.

$X^-$ represents a non-nucleophilic anion.

The number of carbon atoms in the organic group as $R_{201}$, $R_{202}$ or $R_{203}$ is generally from 1 to 30, preferably, from 1 to 20.

Two members of $R_{201}$ to $R_{203}$ may be bonded to each other to form a ring structure, and the ring may have an oxygen atom, sulfur atom, ester bond, amide bond, or carbonyl group therein.

As the group formed by joining two members of $R_{201}$ to $R_{203}$ includes an alkylene group (for example, butylene group or pentylene group).

Specific examples of the organic group as $R_{201}$, $R_{202}$, and $R_{203}$ include, for example, groups corresponding to those in the compounds (Z1-1), (Z1-2), and (Z1-3) to be described later.

Compounds having a plurality of structures represented by the general formula (ZI) may also be adopted. For example, compounds having such a structure that at least one of $R_{201}$ to $R_{203}$ of the compounds represented by the general formula (ZI) joins with at least one of $R_{201}$ to $R_{203}$ of other compounds represented by the general formula (ZI).

Further preferred (ZI) ingredients include compounds (Z1-1), (Z1-2), and (Z1-3) to be described below.

The compound (Z1-1) is an arylsulfonium compound in which at least one of $R_{201}$ to $R_{203}$ of the general formula (ZI) is an aryl group, that is, a compound having arylsulfonium as a cation.

In the arylsulfonium compound, all of $R_{201}$ to $R_{203}$ may be an aryl group, and a portion of $R_{201}$ to $R_{203}$ may be an aryl group, and the residues may be an aryl group and a cycloalkyl group.

The arylsuofonium compound includes, for example, triarylsulfonium compounds, diarylalkyl sulfonium compounds, aryldialkyl sulfonium compounds, diarylcycloalkyl sulfonium compounds, and aryldicycloalkyl sulfonium compounds.

The aryl group of the arylsulfonium compound is, preferably, a phenyl group and a naphthyl group and more preferably, a phenyl group. In a case where the arylsulfonium compound has two or more aryl groups, the two or more aryl groups may be identical with or different from each other.

The alkyl group which is optionally present in the arylsulfonium compound is preferably a linear or branched alkyl group of from 1 to 15 carbon atoms and includes, for example, a methyl group, ethyl group, propyl group, n-butyl group, sec-butyl group or t-butyl group.

The cycloalkyl group which is optionally present in the arylsulfonium compound is, preferably, a cycloalkyl group of from 3 to 15 carbon atoms and includes, for example, a cyclopropyl group, cyclobutyl group is cyclohexyl group, The aryl group, alkyl group, or cycloalkyl group for $R_{201}$ to $R_{203}$ may have an alkyl group (for example, of 1 to 15 carbon atoms), cycloalkyl group (for example, of 3 to 15 carbon atoms), aryl group, alkoxy group (for example, 1 to 15 carbon atoms), halogen atom, hydroxyl group or phenylthio group as a substituent. The substituent includes, preferably, a linear or branched alkyl group of 1 to 12 carbon atoms, cycloalkyl group of 3 to 12 carbon atoms, alkoxy group of 1 to 12 carbon atom, and, most preferably, an alkyl group of 1 to 4 carbon atoms, and alkoxy group of 1 to 4 carbon atoms. The substituent may be substituted on any one of three members of $R_{201}$ to $R_{203}$, and may be substituted on all of the three members. In a case where $R_{201}$ to $R_{203}$ each independently represents an aryl group, the substituent is preferably at the p-position of the aryl group.

The non-nucleophilic anion as $X^-$ includes, for example, a sulfonic acid anion, carboxylic acid anion, sulfonylimide anion, bis(alkylsulfonyl)imide anion, and tris(alkylsulfonyl) methyl anion.

The non-nucleophilic anion means an anion with extremely low effect of causing nucleophilic reaction, which is an anion capable of suppressing aging decomposition by intra-molecular nucleophilic reaction.

The sulfonic acid anion includes, for example, an aliphatic sulfonic acid anion, aromatic sulfonic acid anion, or camphor sulfonic acid anion.

The carboxylic acid anion includes, for example, an aliphatic carboxylic acid anion, aromatic carboxylic acid anion, and aralkyl carboxylic acid anion.

The aliphatic group in the aliphatic sulfonic acid anion includes, for example, an alkyl group of 1 to 3 carbon atoms, specifically, a methyl group, ethyl group, propyl group, isopropyl group, n-butyl group, isobutyl group, secbutyl group, pentyl group, neopentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, eicosyl group and a cycloalkyl group of 3 from 30 carbon atoms, specifically, a cyclopropyl group, cyclopentyl group, cyclohexyl group, adanantyl group, norbornyl group, and boronyl group.

The aromatic group in the aromatic sulfonic acid anion include, preferably, aryl group of 6 to 14 carbon atoms, for example, a phenyl group, tolyl group, and naphthyl group.

The alkyl group, cycloalkyl group and aryl group in the above aliphatic sulfonate anion and aromatic sulfonate anion may have a substituent.

As the substituents, e.g., a halogen atom, an alkyl group, an alkoxyl group and an alkylthio group can be exemplified.

As the halogen atom, e.g., a chlorine atom, a bromine atom, a fluorine atom, and an iodine atom can be exemplified.

As the alkyl group, preferably an alkyl group having from 1 to 15 carbon atoms, e.g., a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group and an eicosyl group can be exemplified.

As the alkoxyl group, preferably an alkoxyl group having from 1 to 5 carbon atoms, e.g., a methoxy group, an ethoxy group, a propoxy group and a butoxy group can be exemplified.

As the alkylthio group, preferably an alkylthio group having from 1 to 15 carbon atoms, e.g., a methylthio group, an ethylthio group, a propylthio group, an isopropylthio group, an n-butylthio group, an isobutylthio group, a sec-butylthio group, a pentylthio group, a neopentylthio group, a hexylthio group, a heptylthio group, an octylthio group, a nonylthio group, a decylthio group, a undecylthio group, a dodecylthio group, a tridecylthio group, a tetradecylthio group, a pentadecylthio group, a hexadecylthio group, a heptadecylthio group, an octadecylthio group, a nonadecylthio group and an eicosylthio group can be exemplified. Further, the alkyl group, alkoxyl group and alkylthio group may further be substituted with a halogen atom (preferably a fluorine atom).

As the aliphatic hydrocarbon group in the aliphatic carboxylate anion, the same aliphatic hydrocarbon groups as in the aliphatic sulfonate anion can be exemplified.

As the aromatic group in the aromatic carboxylate anion, the same aromatic groups as in the aromatic sulfonate anion can be exemplified.

As the aralkyl group in the aralkylcarboxylate anion, preferably an aralkyl group having from 6 to 12 carbon atoms, e.g., a benzyl group, a phenethyl group, a naphthylmethyl group and a naphthylethyl group can be exemplified.

The alkyl group, cycloalkyl group, aryl group and aralkyl group in the aliphatic carboxylate anion, the aromatic carboxylate anion and the aralkylcarboxylate anion may have a substituent, and as the substituents, e.g., the same halogen atoms, alkyl groups, alkyl groups, alkoxyl groups and alkylthio groups as in the aliphatic sulfonate anion and the aromatic sulfonate anion can be exemplified.

As the sulfonylimide anion, e.g., a saccharin anion can be exemplified.

The alkyl groups in the bis(alkylsulfonyl)imide anion, and the tris(alkylsulfonyl)methyl anion are preferably alkyl groups having from 1 to 5 carbon atoms, e.g., a methyl group, an ethyl group, a propyl group, an isopropyl group, an n-butyl group, an isobutyl group, a sec-butyl group, a pentyl group and a neopentyl group are exemplified. These alkyl groups may have a substituent and, e.g., a halogen atom, an alkyl group substituted with a halogen atom, an alkoxyl group, and an alkylthio group can be exemplified as the substituents. An alkyl group substituted with a fluorine atom is preferred.

As other non-nucleophilic anions, e.g., fluorinated phosphorus, fluorinated boron and fluorinated antimony can be exemplified.

As the non-nucleophilic anions represented by X$^-$, an aliphatic sulfonate anion substituted with a fluorine atom, an aromatic sulfonate anion substituted with a fluorine atom or a group having a fluorine atom, a bis(alkylsulfonyl)imide anion in which the alkyl group is substituted with a fluorine atom, and a tris(alkylsulfonyl)methide anion in which the alkyl group is substituted with a fluorine atom are preferred. More preferred non-nucleophilic anions represented by X$^-$ are a fluorine-substituted aliphatic sulfonate anion having from 4 to 8 carbon atoms, and especially preferred non-nucleophilic anions are a nonafluorobutanesulfonate anion, and a perfluoro-octanesulfonate anion.

Compound (ZI-2) is described below.

Compound (ZI-2) is a compound in the case where $R_{201}$, $R_{202}$ and $R_{203}$ in formula (ZI) each represents an organic group not containing an aromatic ring. The aromatic ring here also includes an aromatic ring containing a hetero atom.

The organic groups not containing an aromatic ring represented by $R_{201}$ to $R_{203}$ generally have from 1 to 30 carbon atoms, and preferably from 1 to 20 carbon atoms.

$R_{201}$, $R_{202}$ and $R_{203}$ each preferably represents an alkyl group, a cycloalkyl group, an allyl group, or a vinyl group, more preferably a straight chain, branched or cyclic 2-oxoalkyl group, or an alkoxycarbonylmethyl group, and most preferably a straight or branched 2-oxoalkyl group.

The alkyl group represented by $R_{201}$ to $R_{203}$ may be straight chain or branched, preferably a straight chain or branched alkyl group having from 1 to 10 carbon atoms (e.g., a methyl group, an ethyl group, a propyl group, a butyl group, a pentyl group), more preferably a straight chain or branched 2-oxoalkyl group or an alkoxycarbonylmethyl group.

The cycloalkyl group represented by $R_{201}$ to $R_{203}$ is preferably a cycloalkyl group having from 3 to 10 carbon atoms (e.g., a cyclopentyl group, a cyclohexyl group, a norbonyl group), more preferably a cyclic 2-oxoalkyl group.

As the preferred straight chain, branched or cyclic 2-oxoalkyl group represented by $R_{201}$ to $R_{203}$, the above alkyl group and cycloalkyl group having >C=O at the 2-position can be exemplified.

As the alkoxyl group in the alkoxycarbonylmethyl group represented by $R_{201}$ to $R_{203}$, preferably an alkoxyl group having from 1 to 5 carbon atoms (e.g., a methoxy group, an ethoxy group, a propoxy group, a butoxy group, a pentoxy group) can be exemplified.

$R_{201}$ to $R_{203}$ may further be substituted with a halogen atom, an alkoxyl group (e.g., having from 1 to 5 carbon atoms), a hydroxyl group, a cyano group or a nitro group.

Compound (ZI-3) is a compound represented by the following formula (ZI-3), which compound has a phenacylsulfonium salt structure.

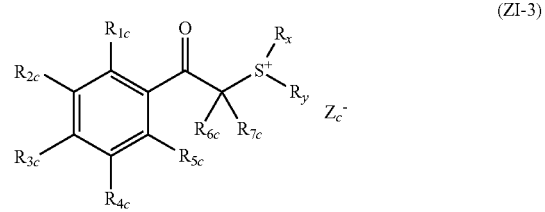

(ZI-3)

In formula (ZI-3), $R_{1c}$, $R_{2c}$, $R_{3c}$, $R_{4c}$ and $R_{5c}$ each represents a hydrogen atom, an alkyl group, a cycloalkyl group, an alkoxyl group or a halogen atom $R_{6c}$ and $R_{7c}$ each represents a hydrogen atom, an alkyl group or a cycloalkyl group.

$R_x$ and $R_y$ each represents an alkyl group, a cycloalkyl group, an allyl group or a vinyl group.

Any two or more of $R_{1c}$ to $R_{5c}$, $R_{6c}$ and $R_{7c}$, and $R_x$ and $R_y$, may be bonded to each other to form a cyclic structure, and the cyclic structure may contain an oxygen atom, a sulfur atom, an ester bond or an amide bond. As the groups formed by the bonding of any two or more of $R_{1c}$ to $R_{5c}$, $R_{6c}$ and $R_{7c}$, and $R_x$ and $R_y$, a butylene group and a pentylene group can be exemplified.

$Z_c^-$ represents a non-nucleophilic anion, and the same non-nucleophilic anion represented by X$^-$ in formula (ZI) can be exemplified.

The alkyl groups represented by $R_{1c}$ to $R_{7c}$ may be either straight chain or branched, e.g., an alkyl group having from 1 to 20 carbon atoms, preferably a straight chain or branched alkyl group having from 1 to 12 carbon atoms (e.g., a methyl group, an ethyl group, a straight chain or branched propyl group, a straight chain or branched butyl group, a straight chain or branched pentyl group) can be exemplified.

As the cycloalkyl groups represented by $R_{1c}$ to $R_{7c}$, a cycloalkyl group having from 3 to 8 carbon atoms (e.g., a cyclopentyl group and a cyclohexyl group) can be exemplified, The alkoxyl groups represented by $R_{1c}$ to $R_{7c}$ may be straight chain, branched or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, a straight chain or branched pentoxy group), a cyclic alkoxyl group having from 3 to 8 carbon atoms (e.g., a cyclopentyloxy group and a cyclohexyloxy group) can be exemplified.

It is preferred that any of $R_{1c}$ to $R_{5c}$ represents a straight chain or branched alkyl group, a cycloalkyl group, or a straight chain, branched or cyclic alkoxyl group, it is more preferred that the sum total of the carbon atoms of $R_{1c}$ to $R_{5c}$ is from 2 to 15, by which the solubility in a solvent increases and generation of particles during preservation can be restrained.

As the alkyls group represented by $R_x$ and $R_y$, the same alkyl groups represented by $R_{1c}$ to $R_{7c}$ can be exemplified. The alkyl groups represented by $R_x$ and $R_y$ are more preferably a straight chain or branched 2-oxoalkyl group and an alkoxy-carbonylmethyl group. As the straight chain or branched 2-oxoalkyl group, the groups having >C=O on the 2-position of the alkyl groups represented by $R_{1c}$ to $R_{7c}$ can be exemplified. As the alkoxyl group in the alkoxycarbonylmethyl group, the same alkoxyl groups as those represented by $R_{1c}$ and $R_{5c}$ can be exemplified.

As the cycloalkyl groups represented by $R_x$ and $R_y$, the same cycloalkyl groups as represented by $R_{1c}$ to $R_{7c}$ can be exemplified. The cycloallyl groups represented by $R_x$ and $R_y$ are more preferably cyclic 2-oxoalkyl groups. As the cyclic 2-oxoalkyl groups, the groups having >X=O on the 2-position of the cycloalkyl groups represented by $R_{1c}$ to $R_{7c}$ can be exemplified.

$R_x$ and $R_y$ each preferably represents an alkyl group or a cycloalkyl group having 4 or more carbon atoms, more preferably having 6 or more carbon atoms, and still more preferably an alkyl group or a cycloalkyl group having 8 or more carbon atoms.

In formulae (ZII) and (ZIII), $R_{204}$, $R_{205}$, $R_{206}$ and $R_{207}$ each represents an aryl group, an alkyl group or a cycloalkyl group.

The aryl group represented by $R_{204}$ to $R_{207}$ is preferably a phenyl group or a naphthyl group, and more preferably a phenyl group.

The alkyl group represented by $R_{204}$ to $R_{207}$ may be straight chain or branched, preferably a straight chain or branched alkyl group having from 1 to 10 carbon atoms (e.g., a methyl group, an ethyl group, a propyl group, a butyl group, a pentyl group).

The cycloalkyl group represented by $R_{204}$ to $R_{207}$ is preferably a cycloalkyl group having from 3 to 10 carbon atoms (e.g., a cyclopentyl group, a cyclohexyl group, a norbonyl group).

The aryl group, alkyl group or cycloalkyl group represented by $R_{204}$ to $R_{207}$ may have a substituent. As the substituents that the aryl group, alkyl group or cycloalkyl group represented by $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group and a phenylthio group can be exemplified.

$X^-$ represents a non-nucleophilic anion, and the same non-nucleophilic anions as those represented by $X^-$ in formula (ZI) can be exemplified.

As the compounds capable of decomposing and generating an acid upon irradiation with actinic ray or radiation that can be used, compounds represented by the following formula (ZIV), (ZV) or (ZVI) can further be exemplified.

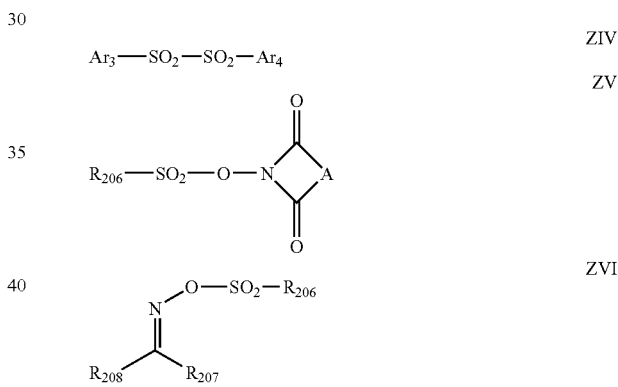

In formulae (ZIV), (ZV) and (ZVI), $Ar_3$ and $Ar_4$ each represents an aryl group.

$R_{206}$, $R_{207}$ and $R_{208}$ each represents an alkyl group, a cycloalkyl group or an aryl group.

A represents an alkylene group, an alkenylene group or an arylene group.

The compounds capable of decomposing and generating an acid upon irradiation with actinic ray or radiation that can be used are more preferably represented by formula (ZI), (ZII) or (ZIII).

The examples of the compounds capable of decomposing and generating an acid upon irradiation with actinic ray or radiation that can be especially preferably used are shown below.

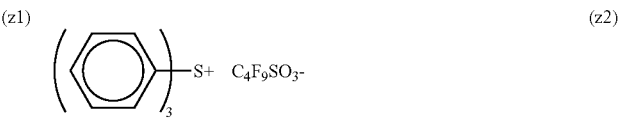

-continued
(z3) 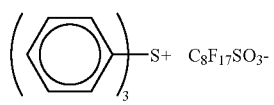
(z4) 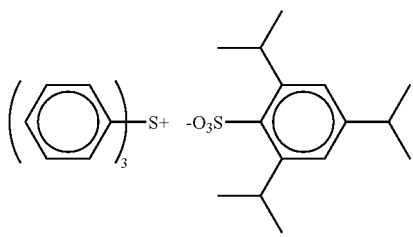
(z5) 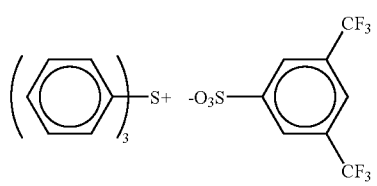
(z6) 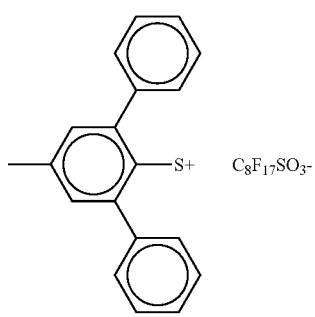
(z7) 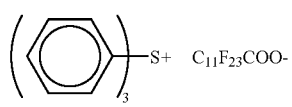
(z8) 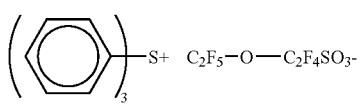
(z9) 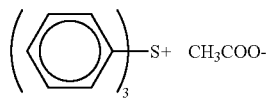
(z10) 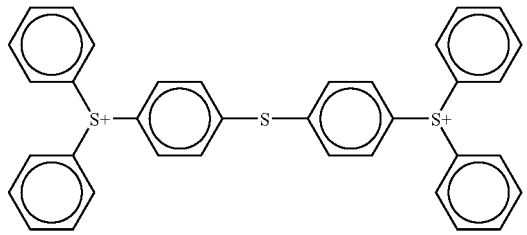
(z11) 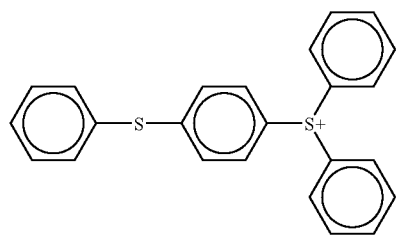
(z12) 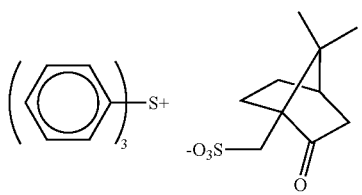
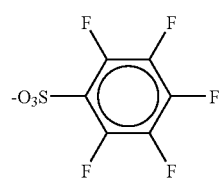

-continued

-continued
(z29) 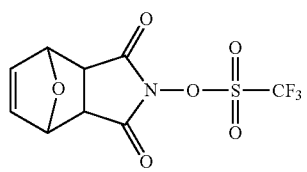
(z30) 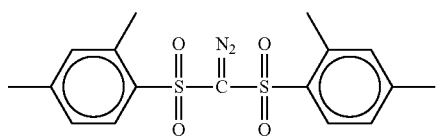
(z31) 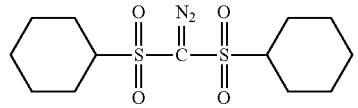
(z32) 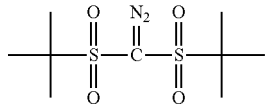
(z33) 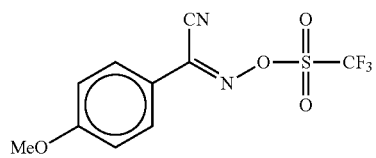
(z34) 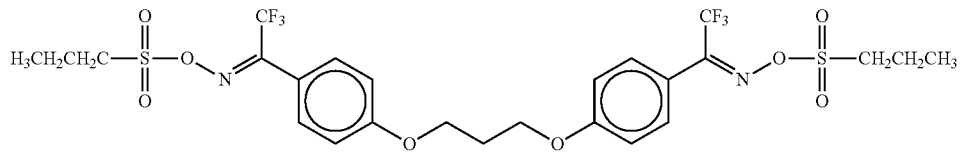
(z35) 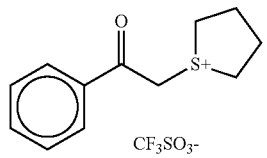
(z36) 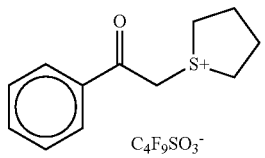
(z37) 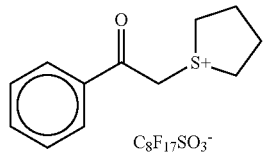
(z38) 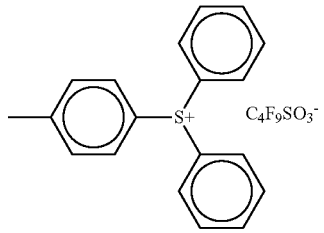
(z39) 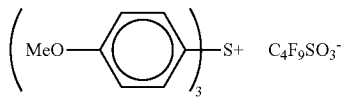
(z40) 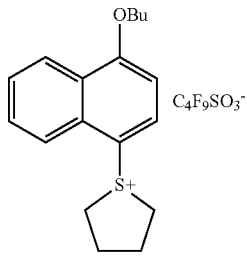
(z41) 
(z42) 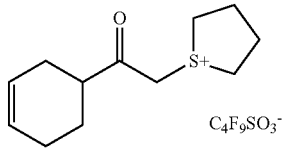

-continued
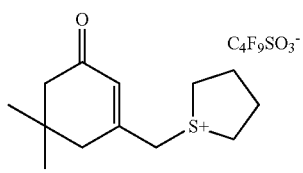 (z43)
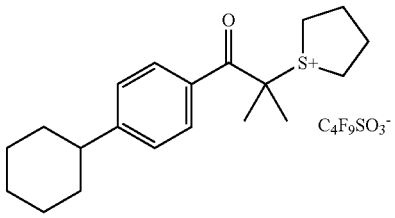 (z44)
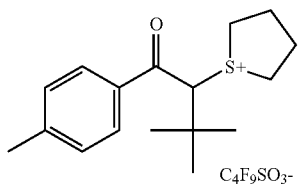 (z45)
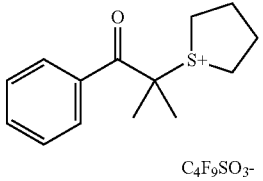 (z46)
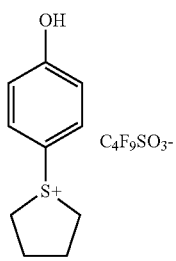 (z47)
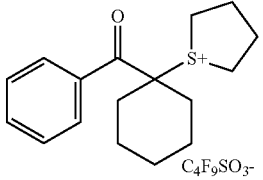 (z48)
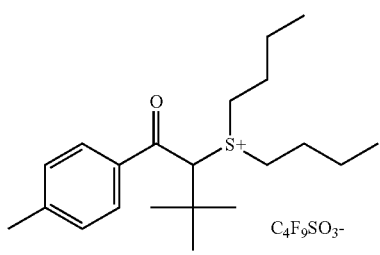 (z49)
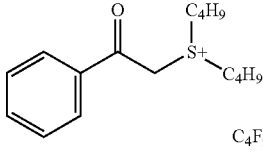 (z50)
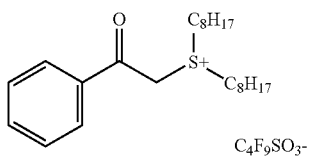 (z51)
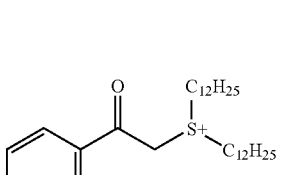 (z52)
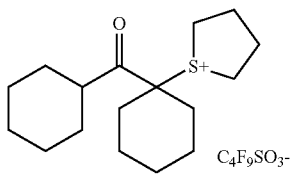 (z53)
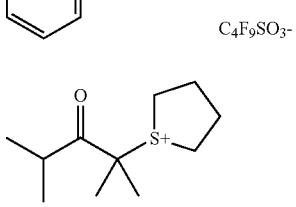 (z54)
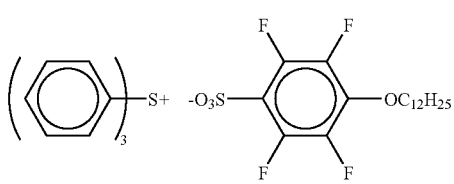 (z55)
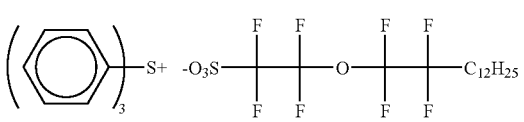 (z56)
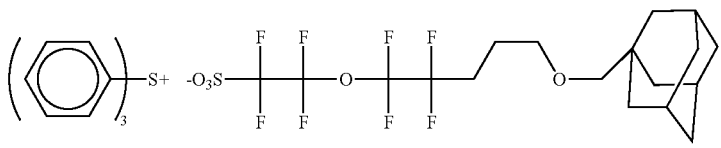 (z57)

(z58) 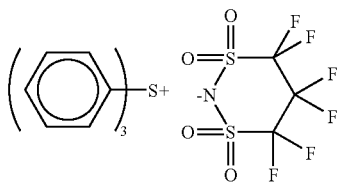

(z59) 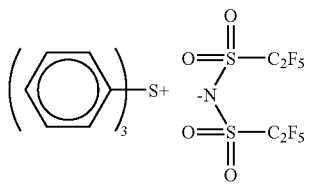

The compounds of component (B) can be used alone, or two or more compounds may be used in combination.

The content of the compounds of component (B) in the positive resist composition in the invention is preferably from 0.1 to 20 mass % on the basis of the solids content in the composition, more preferably from 0.5 to 10 mass %, and still more preferably from 1 to 7 mass %.

(C) Dissolution Inhibiting Compound Having a Molecular Weight of 3,000 or Less Capable of Decomposing by the Action of an Acid and Increasing the Solubility in an Alkaline Developer (Hereinafter Also Referred to as "Dissolution Inhibiting Compound"):

It is preferred for the resist composition in the invention to contain a compound having a molecular weight of 3,000 or less and capable of decomposing by the action of an acid to increase the solubility in an alkaline developer (hereinafter also referred to as "dissolution inhibitor").

As the dissolution inhibitor, not to reduce transmission of 220 nm or less, alicyclic or aliphatic compounds containing an acid-decomposable group, such as the cholic acid derivative containing an acid-decomposable group as described in Proceeding of SPIE, 2724, 355 (1996) are preferred. As the acid-decomposable groups and alicyclic structures, the same groups and structures as described in the resins in component (A) can be exemplified.

The molecular weight of the dissolution inhibitor in the invention is 3,000 or less, preferably from 300 to 3,000, and more preferably from 500 to 2,500.

The addition amount of the dissolution inhibitor is preferably from 1 to 30 mass % based on the total solids content of the resist composition, more preferably from 2 to 20 mass %.

The specific examples of dissolution inhibitors are shown below, but the invention is not limited thereto.

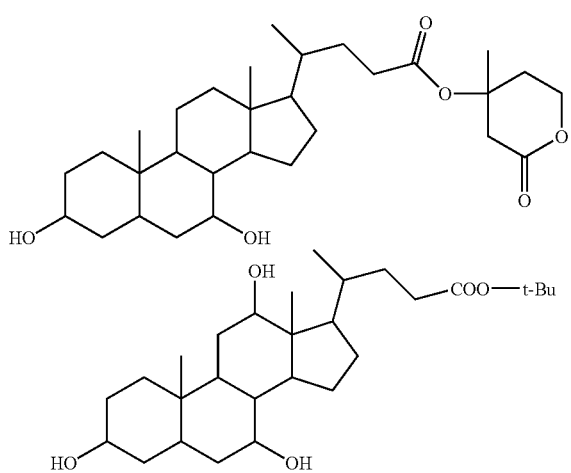

-continued

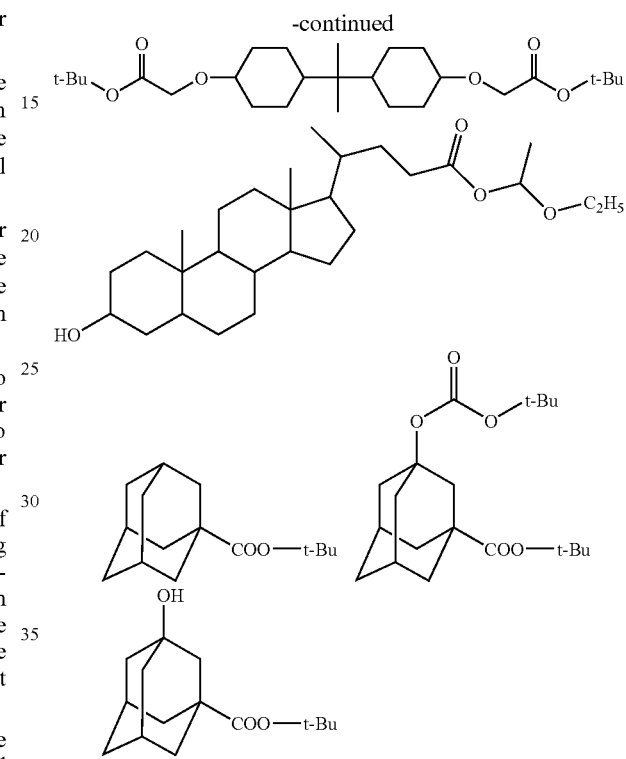

[4] (D) Basic Compound

The positive resist composition in the invention can further contain a basic compound. As the basic compounds, e.g., a nitrogen-containing basic compound, a basic ammonium salt, a basic sulfonium salt and a basic iodonium salt are used. The basic compounds should be sufficient so long as they do not reduce sublimation and resist performances.

The basic compound is a component to control the diffusion of the acid generated from an acid generator by exposure in the resist film and having a function of suppressing undesired chemical reaction in the non-exposed area. By compounding such a basic compound, the diffusion of the acid generated from an acid generator by exposure in the resist film can be controlled, the preservation stability of a resist composition to be obtained can be improved, the resolution as a resist is further improved, the line width variation due to the fluctuation of post exposure time delay (PED) from exposure to development process can be prevented, so that a composition extremely excellent in process stability can be obtained.

As the nitrogen-containing basic compounds, e.g., primary, secondary and tertiary aliphatic amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, imide derivatives, and nitrogen-containing compounds having a cyano group can be exemplified.

As the aliphatic amines, e.g., methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, dimethylamine, diethylamine, di-n-propylamine, diisopropyl-amine, di-n-butylamine, diisobutylamine, di-sec-butylamine, dipentylamine, dicyclopentylamine, dihexylamine, dicyclo-hexylamine, diheptylamine, dioctylamine, dinonylamine, didecylamine, didodecylamine, dicetylamine, N,N-dimethyl-methylenediamine, N,N-dimethylethylenediamine, N,N-dimethyltetraethylenepentamine, tricethylamine, triethyl-amine, tri-n-propylamine, triisopropylamine, tri-n-butyl-amine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine, dimethylethyl-amine, methylethylpropylamine, benzylamine, phenethylamine, and benzyldimethylamine are exemplified.

As the aromatic amines and the heterocyclic amines, e.g., aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitro-aniline, 4-nitroaniline, 2,4-dinitroaniline, 2,6-dinitro-aniline, 3,5-dinitroaniline, N,N-dimethyltoluidine, etc.), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, N-methylpyrrole, etc.), oxazole derivatives (e.g., oxazole, isooxazole, etc.), thiazole derivatives (e.g., thiazole, isothiazole, etc.), imidazole derivatives (e.g., imidazole, 4-methylimidazole, 4-methyl-2-phenylimidazole, etc.), pyrazole derivatives, furazane derivatives, pyrroline derivatives (e.g., pyrroline, 2-methyl-1-pyrroline, etc.), pyrrolidine derivatives (e.g., pyrrolidine, N-methylpyrrolidine, pyrrolidinone, N-methyl-pyrrolidone, etc.), imidazoline derivatives, imidazolidine derivatives, pyridine derivatives (e.g., pyridine, methyl-pyridine, ethylpyridine, propylpyridine, butylpyridine, 4-(1-butylpentyl)pyridine, dimethylpyridine, trimethyl-pyridine, triethylpyridine, phenylpyridine, 3-methyl-2-phenylpyridine, 4-tert-butylpyridine, diphenylpyridine, benzylpyridine, methoxypyridine, butoxypyridine, dimethoxy-pyridine, 1-methyl-2-pyridone, 4-pyrrolidinopyridine, 1-methyl4-phenylpyridine, 2-(1-ethylpropyl)pyridine, aminopyridine, dimethylaminopyridine, etc.), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline, 3-quinolinecarbonitrile, etc.), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives and uridine derivatives can be exemplified.

As the nitrogen-containing compounds having a carboxyl group, e.g., aminobenzoic acid, indolecarboxylic acid, amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine), etc., can be exemplified.

As the nitrogen-containing compounds having a sulfonyl group, e.g., 3-pyridinesulfonic acid, pyridinium p-toluenesulfonate, etc., can be exemplified.

As the nitrogen-containing compounds having a hydroxyl group, e.g., 2-hydroxypyridine, aminocresol, 2,4-quinolinediol, 3-indolemethanol hydrate, monoethanolamine, diethanol-amine, triethanolamine, N-ethyldiethanolamine, N,N-diethyl-ethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidinethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxy-julolidine, 3-quinuclidinol, 3-tropanol, 1-methyl-2-pyrrolidinethanol, 1-aziridinethanol, N-2-hydroxyethyl)-phthalimide, N-(2-hydroxyethyl)isonicotinamide, etc., can be exemplified.

As the amide derivatives, e.g., formamide, N-methylformamide, N,N-dimethylformamide, acetamide, N-methylacetamide, N,N-dimethylacetamide, propionamide, benzamide, etc., can be exemplified.

As the imide derivatives, e.g., phthalimide, succinimide, maleimide, etc., can be exemplified.

As the nitrogen-containing compounds having a cyano group, specifically, e.g., 3-(diethylamino)propiononitrile, N,N-bis(2-hydroxyethyl)3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-amino-propionate, methyl N-(2-cyanoethyl)-N-(2-hydroxyethyl)-3-aminopropionate, methyl N-(2-acetoxyethyl)-N-(2-cyano-ethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyano-ethyl)-3-aminopropiononitrile, N-2-cyanoethyl)-N-(2-formyloxyethyl)-3-aminopropiononitrile, N-(2-cyanoethyl)-N-(2-methoxyethyl)-3-aminopropiononitrile, N-(2-cyano-ethyl)-N-[2(methoxymethoxy)ethyl]-3-aminopropiononitrile, N-(2-cyanoethyl)-N-(3-hydroxy-1-propyl)-3-aminopropiono-nitrile, N-(3-acetoxy-1-propyl)-N-(2-cyanoethyl)-3-amino-propiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)-aminoacetonitrile, N,N-bis(2-formyloxyethyl) aminoacetonitrile, N,N-bis(2-methoxyethyl) aminoacetonitrile, N,N-bis[2-(methoxymethoxy)-ethyl] aminoacetonitrile, methyl N-cyanomethyl-N-(2-methoxyethyl)-3-aminopropionate, methyl N-cyanomethyl-N-(2-hydroxyethyl)-3-aminopropionate, methyl N-2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl) aminoacetonitrile, N,N-bis(cyano-methyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylamino-propionate, cyanomethyl N,N-bis(2-hydroxyethyl)-3-amino-propionate, cyanomethyl N,N-bis(2-acetoxyethyl)-3-amino-propionate, cyanomethyl N,N-bis(2-formyloxyethyl)-3-amino-propionate, cyanomethyl N,N-bis(2-methoxyethyl)-3-amino-propionate, cyanomethyl N,N-bis[2-(methoxymethoxy)ethyl]-3-aminopropionate, (2-cyanoethyl) 3-diethylaminopropionate, (2-cyanoethyl) N,N-bis(2-hydroxyethyl)-3-aminopropionate, (2-cyanoethyl) N,N-bis(2-acetoxyethyl)-3-aminopropionate, (2-cyanoethyl) N,N-bis(2-formyloxyethyl)-3-aminopropionate, (2-cyanoethyl) N,N-bis(2-methoxyethyl)-3-aminopropionate, (2-cyanoethyl) N,N-bis[2-(methoxymethoxy)ethyl]-3-amino-propionate, cyanomethyl 1-pyrrolidinepropionate, cyanomethyl 1-piperidinepropionate, cyanomethyl 4-morpholinepropionate, (2-cyanoethyl) 1-pyrrolidinepropionate, (2-cyanoethyl) 1-piperidinepropionate, and (2-cyanoethyl) 4-morpholine-propionate can be exemplified.

As the nitrogen-containing basic compounds, preferably, e.g., 1,5-diazabicyclo[4.3.0]-5-nonene, 1,8-diazabicyclo-[5.4.0]-7-undecene, 1,4-diazabicyclo[2.2.2]octane, 4-dimethylaminopyridine, 1-naphthylamine, piperidines, hexamethylenetetramine imidazoles, hydroxypyridines, pyridines, anilines, hydroxyalkylanilines, 4,4'-diamino-diphenyl ether, pyridinium p-toluenesulfonate, 2,4,6-trimethylpyridinium p-toluenesulfonate, tetramethylammonium p-toluenesulfonate, tetrabutylammonium lactate, tri(cyclo)alkylamines, e.g., triethylamine, tributylamine, tripentylamine, tri-n-octylamine, tri-i-octylamine, tris(ethylhexyl)amine, tridecylamine, tridodecylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, N,N,N',N'-tetrakis(2-hydroxypropyl)ethylenediamine, and tricyclohexylamine, aromatic amines, e.g., aniline, N-methylaniline, N,N-dimethylaniline, 2-methylaniline, 3-methylaniline, 4-methylaniline, 4-nitroaniline, diphenylamine, triphenylamine, naphthylamine, and 2,6-diisopropylaniline, polyethyleneimine, polyallyl-amine, polymer of 2-dimethylaminoethylacrylamide, N-t-butoxycarbonyldi-n-oatylamine, N-t-butoxycarbonyl-di-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-N-methyl-1-adamantyl-amine, N,N-di-t-butoxycarbonyl-1-adamantylamine, N,N-di-t-butoxycarbonyl-N-methyl-1-adamantylamine, N-t-butoxy-carbonyl-4,4'-diaminodiphenylmethane, N,N'-di-t-butoxy-carbonylhexamethylenediamine, N,N,N',N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxyoarbonyl-1,10-diaminodecane, N,N'-di-t-butoxycarbonyl-1,12-diaminododecane, N,N'-di-t-butoxy-carbonyl-4,4'-diaminodiphenylmethane, imidazoles, e.g., N-t-butoxycarbonylbenzimidazole, N-t-butoxycarbonyl-2-methylbenzimidazole, N-t-butoxycarbonyl-2-phenyl-benzinmidazole, formamide, N-methylformamide, N,N-dimethyl-formamide, acetamide, N-methylacetamide, N,N-dimethyl-acetamide, propionamide, benzamide, pyrrolidone, N-methylpyrrolidone, urea, methylurea, 1,1-dimethylurea, 1,3-dimethylurea, 1,1,3,3-tetramethylurea, 1,3-diphenyl-lurea, tri-n-butylthiourea, imidazole, 4-methylimidazole, 4-methyl-2-phenylimidazole, benzimidazole, and 2-phenylbenzimidazole, pyridines, e.g., pyridine, 2-methylpyridine, 4-methylpyridine, 2-ethylpyridine, 4-ethylpyridine, 2-phenylpyridine, 4-phenylpyridine, 2-methyl-4-phenyl-pyridine, nicotine, nicotinic acid, nicotinic acid amide, quinoline, 4-hydroxyquinoline, 8-oxyquinoline, and acridine, piperazines, e.g., piperazine and 1-(2-hydroxyethyl)-piperazine, pyrazine, pyrazole, pyridazine, quinozaline, pyrine, pyrrolidine, piperidine, 3-piperidino-1,2-propane-diol, morpholine, 4-methylmorpholine and 1,4-dimethyl-piperazine can be exemplified.

Of these compounds, nitrogen-containing basic compounds such as 1,5-diazabicyclo[4.3.0]-5-nonene, 1,8-diazabicyclo-[5-4-0]-7-undecene, 1,4-diazabicyclo[2.2.2]octane, 4-dimethylaminopyridine, 1-naphthylamine, piperidine, 4-hydroxypiperidine, 2,2,6,6-tetramethyl-4-hydroxy-piperidine, hexamethylenetetramine, imidazoles, hydroxypyridines, pyridines, 4,4'-diaminodiphenyl ether, triethylamine, tributylamine, tripentylamine, tri-n-octylamine, tris(ethylhexyl)amine, tridodecylamine, N,N-dibydroxyethylaniline, and N-hydroxyethyl-N-ethylaniline are especially preferred.

The positive resist composition in the invention can further use basic ammonium salts as the basic compound. As the specific examples of the basic ammonium salts, the compounds shown below can be exemplified, but the invention is not limited thereto.

Specifically, ammonium hydroxide, ammonium triflate, ammonium pentaflate, ammonium heptaflate, ammonium nonaflate, ammonium undecaflate, ammonium tridecaflate, ammonium pentadecaflate, ammonium methylcarboxylate, ammonium ethylcarboxylate, ammonium propylcarboxylate, ammonium butylcarboxylate, ammonium heptylcarboxylate, ammonium hexylcarboxylate, ammonium octylcarboxylate, ammonium nonylcarboxylate, ammonium decylcarboxylate, ammonium undecylcarboxylate, ammonium dodecadecylcarboxyl, ammonium tridecylcarboxylate, ammonium tetradecylcarboxylate, ammonium pentadecylcarboxylate, ammonium hexadecyl-carboxylate, ammonium heptadecylcarboxylate, and ammonium octadecylcarboxylate can be exemplified.

As the ammonium hydroxide, specifically tetramethyl-ammonium hydroxide, tetraethylammonium hydroxide, tetrapropylammonium hydroxide, tetrabutylammonium hydroxide, tetrapentylammonium hydroxide, tetrahexylammonium hydroxide, tetraheptylammonium hydroxide, methyltrioctylammonium hydroxide, tetraoctylammonium hydroxide, didecyldimethyl-ammonium hydroxide, tetrakisdecylammonium hydroxide, dodecyltrimethylammonium hydroxide, dodecylethyldimethyl-ammonium hydroxide, didodecyldimethylammonium hydroxide, tridodecylmethylammonium hydroxide, myristylmethylammonium hydroxide, dimethylditetradecylammonium hydroxide, hexadecyltrimethylammonium hydroxide, octadecyltrimethyl-ammonium hydroxide, dimethyldioctadecylammonium hydroxide, tetraoctadecylammonium hydroxide, diallyldimethylammonium hydroxide, (2-chloroethyl)trimethylammonium hydroxide, (2-bromoethyl)trimethylammonium hydroxide, (3-bromopropyl)-trimethylammonium hydroxide, (3-bromopropyl)triethyl-ammonium hydroxide, glycidyltrimethylammonium hydroxide, choline hydroxide, (R)-(+)-(3-chloro-2-hydroxypropyl)-trimethylammonium hydroxide, (S)-(−)-(3-chloro-2-hydroxy-propyl)trimethylammonium hydroxide, (3-chloro-2-hydroxy-propyl)trimethylammonium hydroxide, (2-aminoethyl)-trimethylammonium hydroxide, hexamethonium hydroxide, decamethonium hydroxide, 1-azoniaproperan hydroxide, petronium hydroxide, 2-chloro-1,3-dimethyl-2-imidazolinium hydroxide, and 3-ethyl-2-methyl-2-thiazolinium hydroxide can be exemplified.

The basic compounds can be used alone or two or more in combination, and it is preferred to use two or more in combination.

The use amount of the basic compounds is generally from 0.001 to 10 mass % as total amount based on the solids content of the positive resist composition, and preferably from 0.01 to 5 mass %.

(E) Surfactant

The positive resist composition according to the invention can further contain a surfactant (E). The surfactant includes preferably, a fluorine-based and/or a silicon-based surfactant (a fluorine-based surfactant, a silicon-based surfactant, or a surfactant having both a fluorine atom and a silicon atom), or two or more of them.

Since the resist composition according to the invention contains the surfactant (E), it has enhancing effect on the sensitivity, resolution, adhesiveness, suppression of development failure, etc. upon use of exposure light source at 250 nm or less, particularly, 220 nm or less.

The fluorine-based and/or silicon-based surfactants, can include surfactants disclosed in, for example, JP-A Nos. 62-36663, 61-226746, 61-226745, 62-170950, 63-34540, 7-230165, 8-62834, 9-54432, 9-5988, Japanese Patent Application No. 2002-277862, U.S. Pat. Nos. 5,405,720, 5,360, 692, 5,529,881, 5,296,330, 5,436,098, 5,576,143, 5,294,511, and 5,824,451, and commercially available surfactants described below can also be used as they are.

Commercially available surfactants include, for example, fluorine-based or silicone-based surfactants such as F-top EF301, and EF303 (manufactured by Shin-Akita Kasei K.K.), Florad FC430 and 431 (manufactured by Sumitomo 3M, Inc.), Megafac F171, F173, F176, F189, and R08 (manufactured by Dainippon Ink and Chemicals, Inc.), Surflon S-382, SC101, 102, 103, 104, 105, and 106, (manufactured by Asahi Glass Co., Ltd.), Troysol S-366 (manufactured by Troy Chemical Industries, Inc.), etc. Further, a polysiloxane polymer KP-341 (manufactured by Shin-Etsu Chemical Co., Ltd.) can also be used as the silicon-based surfactant.

In addition to the known surfactants described above, surfactants using polymers having a fluoro aliphatic group derived from a fluoro aliphatic compound produced by a telomerization method (also referred to as a telomer method) or an oligomerization method (also referred to as oligomer method) can also be used. The fluoro aliphatic compound can be synthesized by a method described in JP-A No. 2002-90991.

As the polymer having a fluoro aliphatic group, copolymers of monomers having a fluoro aliphatic group and a (poly(oxyalkylene))acrylate and/or (poly(oxyalkyelene)) methacrylate are preferred, and they may be distributed at random or block-copolymerized. The poly(oxyalkylene) group includes poly(oxyethylene) group, poly(oxypropylene) group, poly(oxybutylene) group, etc, and, in addition, may be a unit having alkylenes of different chain length in the same chain, for example, poly(block-connected form of oxyethylene and oxypropylene and oyxethylene) and poly(block connection form of oxyethylene and oxypropylene), etc. Further, the copolymer of the monomers having a fluoro aliphatic group and (poly(oxyalkylene))acrylate (or methacrylate) includes not only binary copolymers but also ternary or higher copolymers formed by simultaneously copolymerizing monomers having two or more different fluoro aliphatic groups and two or more different (poly(oxyalkylene))acrylates (or methacrylates)

For example, the commercially available surfactants include Megafac F178, F-470, F473, F-475, F-476, and F472 (manufactured by Dainippon Ink and Chemicals, Inc.). In addition, they include copolymers of acrylate (or methacrylate) having a $C_6F_{13}$ group and (poly(oxyalkylene))acrylate (or methacrylate), copolymers of acrylate (or methacryalte) having a $C_6F_{13}$ group, (poly(oxyalkylene))acrylate (or methacrylate), and (poly(oxyalkylene))acrylate (or methacrylate), copolymers of acrylate (or methacryalte) having a $C_8F_{17}$ group and (poly(oxyalkylene))acrylate (or methacrylate), and copolymers of acrylate (or methacrylate) having a ($C_8C_{17}$ group, (poly(oxyethylene))acrylate (or methacrylate) and (poly(oxypropylene))acrylate (or methacrylate).

In the invention, surfactants other than the fluorine-based and/or silicon-based surfactants can also be used. Specifically, they include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octyl phenol ether and polyoxyethylene nonyl phenol ethers, sorbitan fatty acid esters such as polyoxyethylene*polyoxypropylene block copolymers, sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

These surfactants may be used alone, or a plurality of surfactants may be used in combination.

The use amount of surfactants (E) is preferably from 0.0001 to 2 mass % to the total amount of the resist composition (excluding solvents), more preferably from 0.001 to 1 mass %.

(F) Organic Solvent

For using the positive resist composition in the invention, the above components are dissolved in a prescribed organic solvent.

As the organic solvents usable in the invention, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, methoxybutanol, and tetrahydrofuran are exemplified.

In the invention, a mixed solvent comprising a solvent having a hydroxyl group in the structure and a solvent not having a hydroxyl group in the structure may be used as organic solvent.

As the solvent having a hydroxyl group, e.g., ethylene glycol, ethylene glycol monomethyl ether, ethylene glycol monoethyl ether, propylene glycol, propylene glycol monomethyl ether, propylene glycol monoethyl ether, and ethyl lactate can be exemplified. Of these solvents, propylene glycol monomethyl ether and ethyl lactate are preferred.

As solvents not having a hydroxyl group, e.g., propylene glycol monomethyl ether acetate, ethylethoxy propionate, 2-heptanone, γ-butyrolactone, cyclohexanone, butyl acetate, N-methylpyrrolidone, N,N-dimethylacetamide, and dimethyl sulfoxide are exemplified. Of these solvents, propylene glycol monomethyl ether acetate, ethylethoxy propionate, 2-heptanone, γ-butyrolactone, cyclohexanone and butyl acetate are preferred, and propylene glycol monomethyl ether acetate, ethylethoxy propionate and 2-heptanone are more preferred.

The mixing ratio (by mass) of a solvent having a hydroxyl group and a solvent not having a hydroxyl group is preferably from 1/99 to 99/1, more preferably from 10/90 to 90/10, and still more preferably from 20/80 to 60/40. A mixed solvent containing 50 mass % or more of a solvent not having a hydroxyl group is particularly preferred in the point of coating uniformity.

It is preferred for the organic solvents to contain at least one of alkylene glycol monomethyl ether acetate and lactate in the point of coating property, film-forming property and the obtained pattern profile. These solvents are preferably contained in 50 mass % or more in total amount to the total organic solvents.

(G) Alkali-Soluble Resin:

The positive resist composition in the invention can further contain (G) a resin that is water-insoluble and alkali-soluble, and not containing an acid-decomposable group. Sensitivity is improved by containing such a resin.

Novolak resins having a molecular weight of from 1,000 to 20,000 or so, and polyhydroxystyrene derivatives having a molecular weight of from 3,000 to 50,000 or so can be used as such resins. Since these resins are great in absorption to the rays of 250 nm or less, it is preferred to use them by partially hydrogenating or in an amount of 30 wt % or less of the total resin amount.

A resin containing a carboxyl group, as an alkali-soluble group, can also be used. For the purpose of improving dry etching resistance, it is preferred for the resins containing a carboxyl group to have a monocyclic or polycyclic alicyclic hydrocarbon group. Specifically, copolymers of methacrylic ester having an alicyclic hydrocarbon structure not showing acid-decomposing property and (meth)acrylic acid, and resins of (meth)acrylic ester of an alicyclic hydrocarbon group having carboxyl groups at terminals are exemplified.

The addition amount of such alkali-soluble resins is generally 30 mass % or less to the total amount of the resin including the acid-decomposable resin.

[8] (H) Carboxylic Acid Onium Salt

The positive resist composition in the invention may contain carboxylic acid onium salt.

As carboxylic acid onium salt (H) for use in the invention, carobxylic acid sulfonium salt, carobxylic acid iodonium salt, and carobxylic acid ammonium salt can be exemplified. As carboxylic acid onium salt (H), iodonium salt and sulfonium salt are preferred. It is preferred that the carboxylate residue of carboxylic acid onium salt (H) of the invention does not contain an aromatic group and a carbon-carbon double bond.

An especially preferred anion moiety is a straight chain or branched, monocyclic or polycyclic alkylcarboxylic acid anion having from 1 to 30 carbon atoms, and the anion of a carboxylic acid in which a part or all of the alkyl groups are substituted with fluorine atoms is more preferred. An oxygen atom may be contained in the alkyl chain, by which the transparency to the lights of 220 nm or less is ensured, sensitivity and resolution are increased, and density dependency and exposure margin are improved.

As fluorine-substituted carboxylic acid anions, anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid are exemplified.

These carboxylic acid onium salts (H) can be synthesized by reacting sulfonium hydroxide, iodonium hydroxide, or ammonium hydroxide and carboxylic acid with silver oxide in an appropriate solvent.

The content of carboxylic acid onium salt (H) in the resist composition is from 0.1 to 20 wt % to all the solids content of the composition, preferably from 0.5 to 10 wt %, more preferably from 1 to 7 wt %.

Other Additives:

If necessary, dyes; plasticizers, photosensitizers, and compounds for accelerating dissolution in a developer (e.g., phenolic compounds having a molecular weight of 1,000 or less, alicyclic or aliphatic compounds having a carboxyl group) may further be added to the resist composition in the present invention.

Such phenolic compounds having a molecular weight of 1,000 or less can be easily synthesized with referring to the methods disclosed, e.g., in JP-A-4-122938, P-A-2-28531, U.S. Pat. No. 4,916,210, and EP 219294.

As the specific examples of the alicyclic or aliphatic compounds having carboxyl groups, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, and cyclohexanedicarboxylic acid are exemplified, but it should not be construed that the invention is limited to these compounds.

In view of the improvement of resolution, it is preferred that the positive resist composition in the invention is used in a thickness of preferably from 50 to 250 nm, and more preferably from 50 to 150 nm. The thickness of this range can be achieved by setting the solids content concentration in the resist composition in a proper range to provide appropriate viscosity to thereby improve coating property and film-forming property, so that good pattern profile can be obtained.

The solids content concentration in the positive resist composition is preferably from 2.5 to 10.0 mass %, more preferably from 2.5 to 8.0 mass %, still more preferably from 2.5 to 6.0 mass %, and especially preferably from 2.5 to 5.0 mass %.

[10] Pattern Forming Method

The positive resist composition of the invention is coated on a prescribed support as follows.

That is, the positive resist composition is coated on a substrate such as the one used in the production of precision integrated circuit elements (e.g., silicon/silicon dioxide coating) by an appropriate coating method with a spinner or a coater in an arbitrary thickness (generally from 50 to 500 nm).

Subsequently, the coated resist is dried by spin or bake and, after forming a resist film, the resist film is subjected to exposure for pattern formation through a mask. The exposure dose can be optionally set, but generally from 1 to 100 mJ/cm$^2$. Thereafter, the resist film is preferably subjected to spin or/and bake, development and rinsing, whereby a good pattern can be obtained. It is preferred for the resist to be subjected to the above bake, and the temperature of the bake is generally from 30 to 300° C. From the viewpoint of the above-described PED, the time from exposure to bake process is preferably shorter.

As the exposure rays, far ultraviolet rays having wavelengths of preferably 250 nm or less, more preferably 220 nm or less are preferred. Specifically, a KrF excimer laser (248 nm), an ArF excimer laser (193 nm), an $F_2$ excimer laser (157 nm), and X-rays are exemplified.

When the positive resist composition of the invention is used for immersion exposure, the use method is as follows.

That is, the positive resist composition is coated on a substrate such as the one used in the production of precision integrated circuit elements (e.g., silicon/silicon dioxide coating) by an appropriate coating method with a spinner or a coater in an arbitrary thickness (generally from 50 to 500 nm). After drying, the resist film is washed with an immersion liquid, if necessary. The washing time is generally from 5 seconds to 5 minutes.

Subsequently, the coated resist is dried by spin or bake, after forming a resist film, the resist film is subjected to exposure (immersion exposure) for pattern formation through a mask via an immersion liquid. For example, in immersion exposure, the resist film is exposed with an immersion liquid between the resist film and the optical lens. The exposure dose can be optionally set, but generally from 1 to 100 mJ/cm$^2$. After exposure, if necessary, the resist film is washed with the immersion liquid. The washing time is generally from 5 seconds to 5 minutes. Thereafter, the resist film is preferably subjected to spin or/and bake, development and rinsing, whereby a good pattern can be obtained. It is preferred for the resist to be subjected to the above bake, and the temperature of the bake is generally from 30 to 300° C. From the viewpoint of the above-described PED, the time from exposure to bake process is preferably shorter.

As the exposure rays, far ultraviolet rays having the wavelength of preferably 250 nm or less, more preferably 220 nm or less, are preferred. Specifically, a KrF excimer laser (248 nm), an ArF excimer laser (193 nm), an $F_2$ excimer laser (157 nm), and X-rays are exemplified.

The variation of performances of a resist at the time of immersion exposure is thought to be resulting from the contact of the resist surface with an immersion liquid.

An immersion liquid for use in immersion exposure is described below.

An immersion liquid for use in immersion exposure preferably has a temperature coefficient of refractive index as small as possible so as to be transparent to the exposure wavelength and to hold the distortion of optical image reflected on the resist to the minimum. In particular, when an ArF excimer laser (wavelength: 193 nm) is used as the exposure light source, it is preferred to use water for easiness of availability and easy handling property, in addition to the above described points.

When water is used as an immersion liquid, to reduce the surface tension of water and to increase the surface activity, a trace amount of additive (a liquid) that does not dissolve the resist layer on a wafer and has a negligible influence on the optical coating of the lower surface of lens elements may be added. As such an additive, aliphatic alcohols having a refractive index almost equal to the refractive index of water is preferred, specifically methyl alcohol, ethyl alcohol and isopropyl alcohol are exemplified. By adding an alcohol having a refractive index almost equal to that of water, even if the alcohol component in water is evaporated and the concentration of the content is changed, the refractive index of the liquid as a whole can be made extremely small. On the other hand, when impurities opaque to the light of 193 nm or a substance largely different from water in a refractive index are mixed, these substances bring about the distortion of the optical image reflected on the resist. Accordingly water is preferably distilled water. Alternatively, pure water filtered through an ion exchange filter may be used.

The electric resistance of water is preferably 18.3 MΩ·cm or higher, and TOC (concentration of organic substance) is preferably 20 ppb or lower. Further, it is preferred that water has been subjected to deaeration treatment.

It is possible to heighten lithographic performance by increasing the refractive index of an immersion liquid. From such a point of view, additives capable of heightening a refractive index may be added to water, or in place of water, heavy water ($D_2O$) may be used.

A film hardly soluble in an immersion liquid (hereinafter also referred to as "topcoat") may be provided between a resist film and an immersion liquid by the resist of the invention so as not to bring a resist film into direct contact with an immersion liquid. The necessary functions required of the topcoat are the aptitude for coating on the upper layer of the resist, the transparency to radiation, especially the transparency to the light of 193 nm, and the immersion liquid-insolubility. It is preferred that the topcoat is not mixed with the resist and can be coated uniformly on the resist upper layer.

From the viewpoint of the transparency to 193 nm, polymers not containing aromatic compounds are preferred as the topcoat. Specifically, hydrocarbon polymers, acrylic ester polymers, polymethacrylic acid, polyacrylic acid, polyvinyl ether, silicon-containing polymers and fluorine-containing polymers are exemplified.

When the topcoat is peeled off, a developer may be used, or a remover may be used separately. As the remover, solvents low in penetration into a resist are preferred. In view of capable of performing peeling process at the same time with the development process of the resist, peeling by an alkaline developer is preferred. From the viewpoint of performing peeling by an alkaline developer, the topcoat is preferably acidic, but from the viewpoint of non-intermixture with the resist, it may be neutral or may be alkaline.

Resolution increases when there is no difference in the refractive indexes between the topcoat and the immersion liquid. In the case where an ArF excimer laser (wavelength: 193 nm) is used as the exposure light source, water is preferred as the immersion liquid, so that the refractive index of the topcoat for ArF immersion exposure is preferably near the refractive index of water (1.44). Further, from the viewpoint of the transparency and refractive index, a thin film is preferred.

In a development process, a developer is used as follows. As the developer of the resist composition, alkaline aqueous solutions of inorganic alkalis, e.g., sodium hydroxide, potassium hydroxide, sodium carbonate, sodium silicate, sodium metasilicate and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanolamine, quaternary ammonium salts, e.g., tetramethylammonium hydroxide and tetraethylammonium hydroxide, and cyclic amines, e.g., pyrrole and piperidine, can be used.

An appropriate amount of alcohols and surfactants may be added to these alkaline aqueous solutions.

Pure water can be used as the rinsing liquid and an appropriate amount of surfactants may be added thereto.

The alkali concentration of an alkaline developer is generally from 0.1 to 20 mass %.

The pH of an alkaline developer is generally from 10.0 to 15.0.

After development process or rinsing process, a process to remove the developer or rinsing liquid on the resist pattern can be performed by supercritical fluid.

EXAMPLE

The invention will be described with reference to Examples, but the invention is not limited thereto.

Synthesis of Resin

Synthesis Example 1

Synthesis of Resin (1)

2-Ethyl-2-adamantyl methacrylate, dihydroxyadamantane methacrylate, norbornane lactone methacrylate, and the following monomer (A) in proportion of 41.8/20/38/0.2 (molar ratio) were prepared and dissolved in propylene glycol monomethyl ether acetatetpropylene glycol monomethyl ether (70/30, mass ratio) to prepare 450 g of a solution having solid concentration of 22 mass %. As a polymerization initiator, 1 mol % of V-601 (manufactured by Wako Pure Chemical Industries Ltd.) was added to the solution, and the reaction solution was dripped to 50 g of a mixed solution of propylene glycol monomethyl ether acetate/propylene glycol monomethyl ether (70/30, mass ratio) heated at 80° C. for 6 hours in a nitrogen atmosphere. After completion of dripping, the reaction solution was stirred for 2 hours, whereby reaction solution (1) was obtained. After termination of the reaction, the temperature of reaction solution (1) was lowered to room temperature, and the reaction solution was crystallized in 4.5 time amount of a mixed solvent of hexane/ethyl acetate (50/50), and precipitated white powder was filtered, thus an object resin (1) was recovered.

The polymer composition ratio found by $^{13}$CNMR and oxidimetry was 40/20.7/39/0.3. The weight average molecular weight of the resin calculated in standard polystyrene equivalent by GPC measurement was 10,000, and the degree of dispersion was 2.3.

Resins (2) to (6) were synthesized in the same manner as in resin (1).

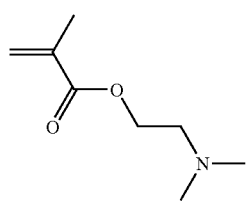

(A)

Synthesis Example 2

Synthesis of Resin (7)

2-Ethyl-2-adamantyl methacrylate, dihydroxyadamantane methacrylate, and norbornane lactone methacrylate in proportion of 40/20/40 (molar ratio) were prepared and dissolved in propylene glycol monomethyl ether acetate/propylene glycol monomethyl ether (60/40, mass ratio) to prepare 450 g of a solution having solid concentration of 22 mass %. The following shown compound (C) and a polymerization initiator, V-601 (manufactured by Wako Pure Chemical Industries Ltd.) were added to the solution each in an amount of 0.1 mol %, and the reaction solution was dripped to 50 g of a mixed solution of propylene glycol monomethyl ether acetate/propylene glycol monomethyl ether (60/40, mass ratio) heated at 80° C. for 6 hours in a nitrogen atmosphere. After completion of dripping, the reaction solution was stirred for 2 hours, whereby reaction solution (7) was obtained. After termination of the reaction, the temperature of reaction solution (7) was lowered to room temperature, and the reaction solution was crystallized in 4.5 time amount of a mixed solvent of hexane/ethyl acetate (50/50, mass ratio), and precipitated white powder was filtered, thus an object resin (7) was recovered.

The polymer composition ratio found by $^{13}$CNMR and oxidimetry was 42/20/38. The weight average molecular weight of the resin calculated in standard polystyrene equivalent by GPC measurement was 7,600, and the degree of dispersion was 2.1.

Resins (8) to (12) were synthesized in the same manner as in resin (6).

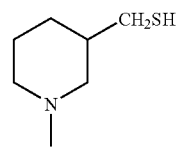

(C)

Synthesis Example 3

Synthesis of Resin (13)

2-Ethyl-2-adamantyl methacrylate, dihydroxyadamantane methacrylate, and norbornane lactone methacrylate in proportion of 40/20/40 (molar ratio) were prepared and dissolved in propylene glycol monomethyl ether acetate/propylene glycol monomethyl ether (60/40, mass ratio) to prepare 450 g of a solution having solid concentration of 22 mass %, As a polymerization initiator, 1 mol % of V-601 (manufactured by Wako Pure Chemical Industries Ltd.) was added to the solution, and the reaction solution was dripped to 50 g of a mixed solution of propylene glycol monomethyl ether acetate/propylene glycol monomethyl ether (60/40, mass ratio) heated at 80° C. for 6 hours in a nitrogen atmosphere. After completion of dripping, the reaction solution was stirred for 2 hours, whereby reaction solution (13) was obtained. After termination of the reaction, the temperature of reaction solution (13) was lowered to room temperature, and the reaction solution was crystallized in 4.5 time amount of a mixed solvent of hexane/ethyl acetate (50/50, mass ratio), and precipitated white powder was filtered, thus an object resin (13) was recovered.

The polymer composition ratio found by $^{13}$CNMR and oxidimetry was 40/20/40. The weight average molecular weight of the resin calculated in standard polystyrene equivalent by GPC measurement was 8,800, and the degree of dispersion was 2.4.

Resin (14) was synthesized in the same manner as in resin (13).

The structures of resins (1) to (20) are shown below.
In resins (7) to (12), the structures of the main chain terminals are shown on the left side.
(1)
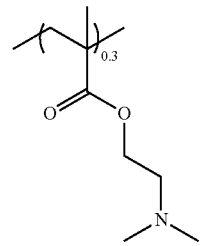 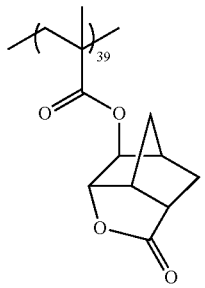
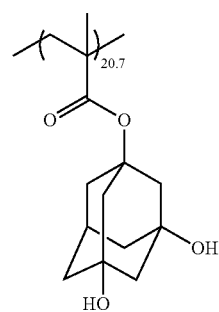 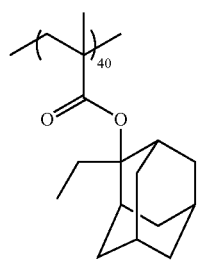
Mw = 10000
Mw/Mn = 2.3
(2)
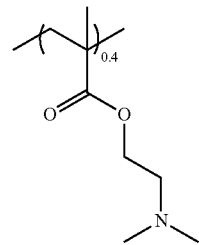 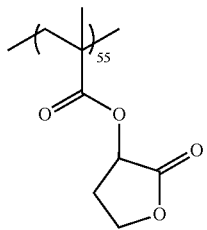
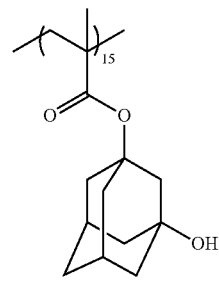 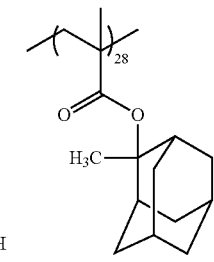
Mw = 8800
Mw/Mn = 2.3
(3)
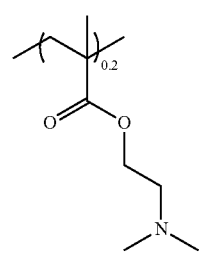 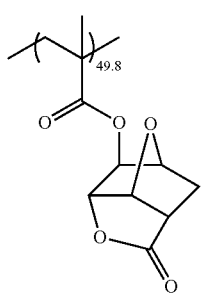
-continued
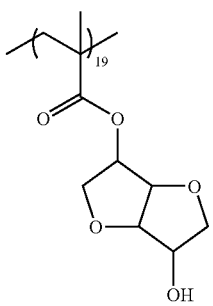 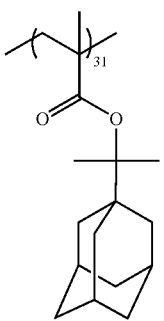
Mw = 24000
Mw/Mn = 2.4
(4)
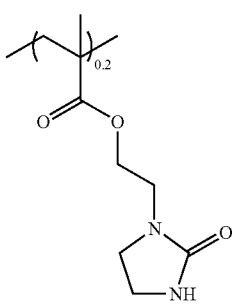 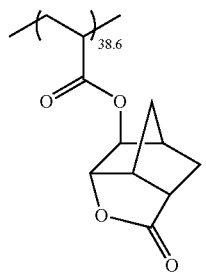
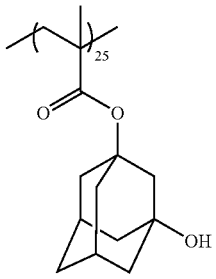 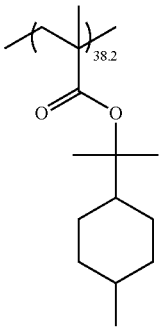
Mw = 15500
Mw/Mn = 2.3
(5)
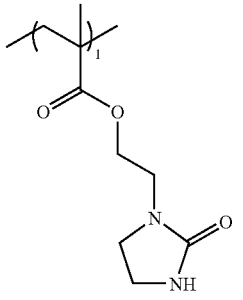 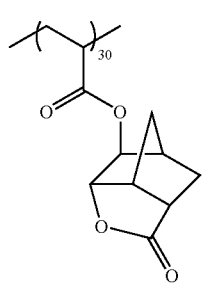
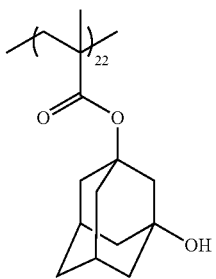 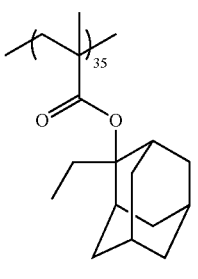

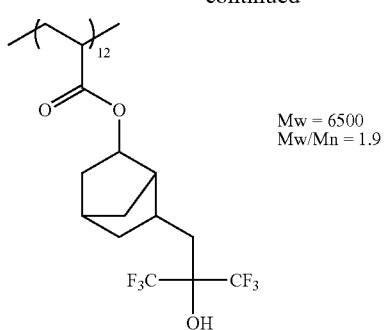
Mw = 6500
Mw/Mn = 1.9
(6)
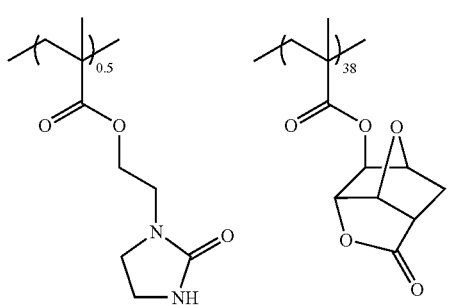
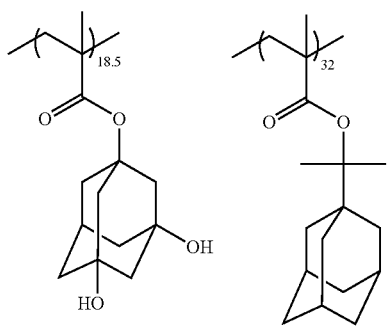
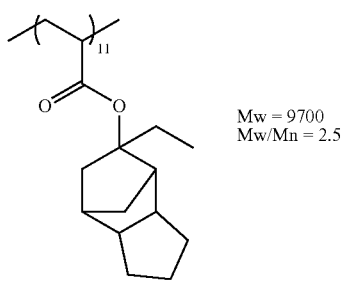
Mw = 9700
Mw/Mn = 2.5
(7)
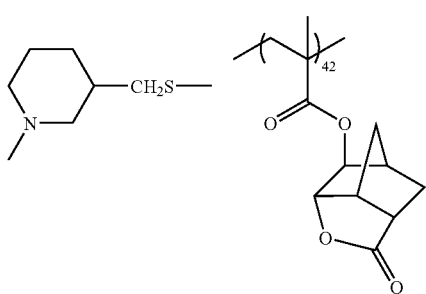
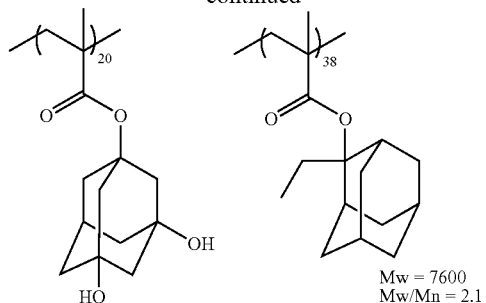
Mw = 7600
Mw/Mn = 2.1
(8)
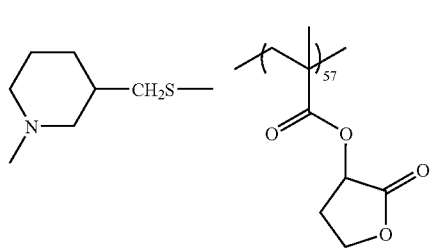
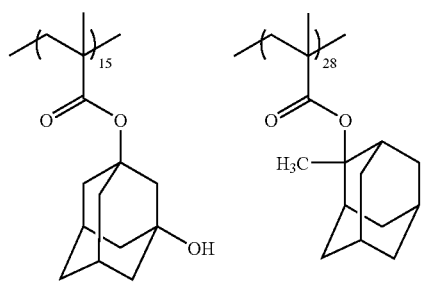
Mw = 5200
Mw/Mn = 1.8
(9)
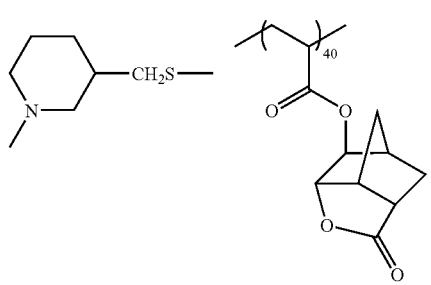
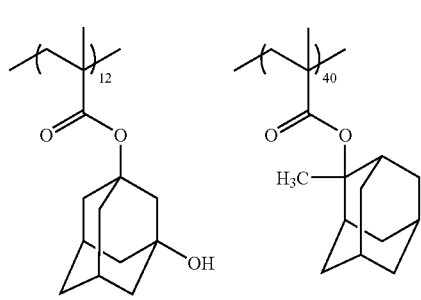

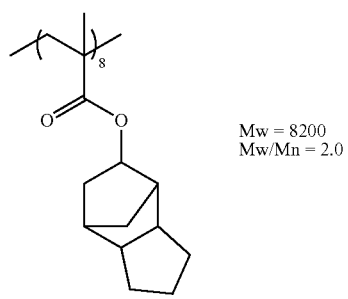
(10)
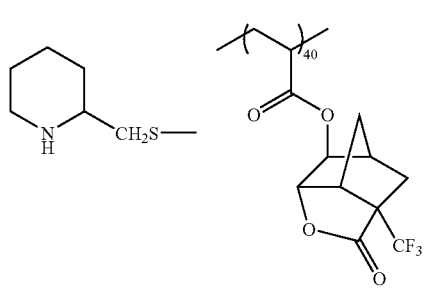
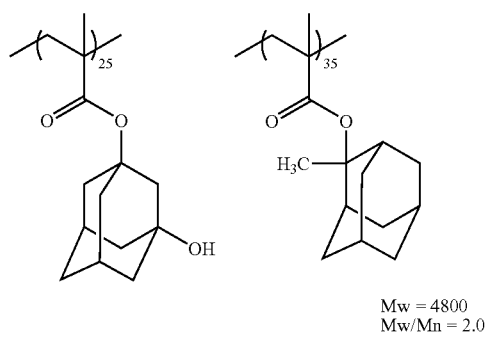
(11)
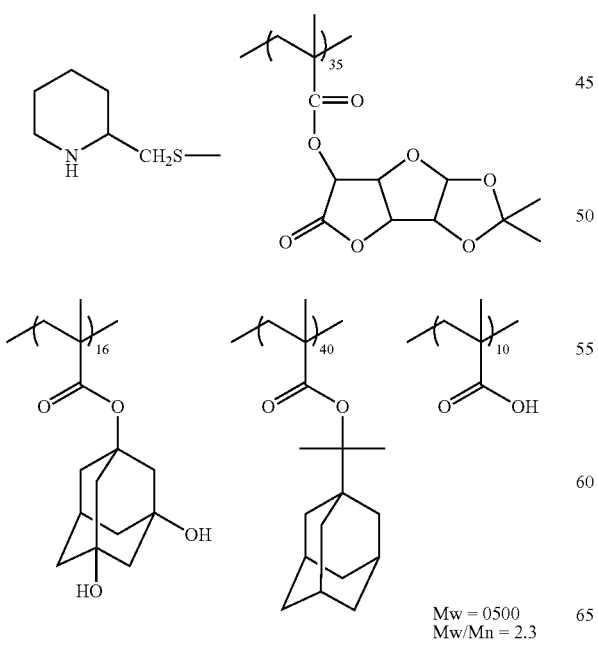
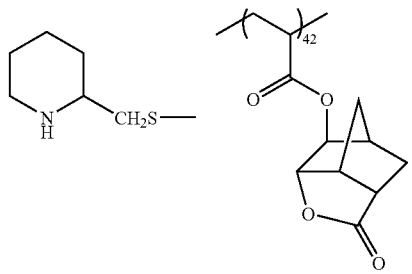
(12)
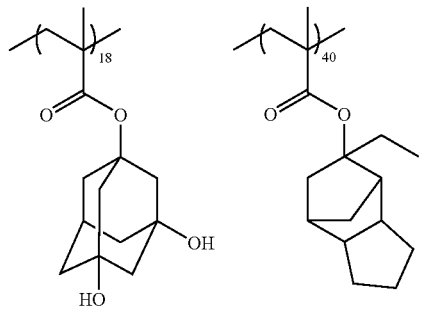
(13)
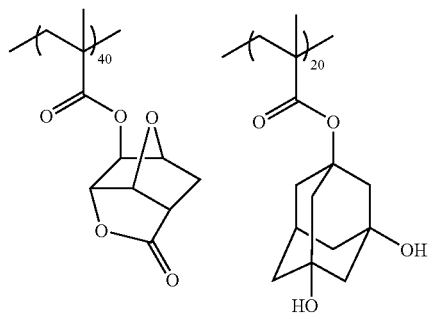
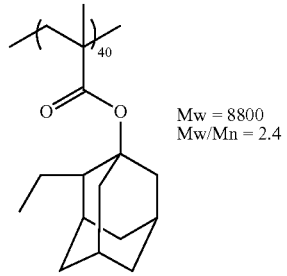
(14)
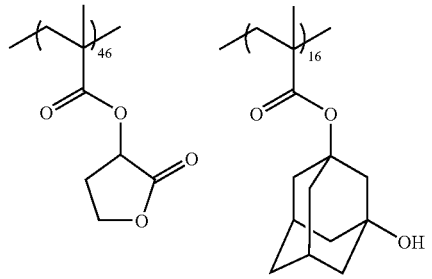

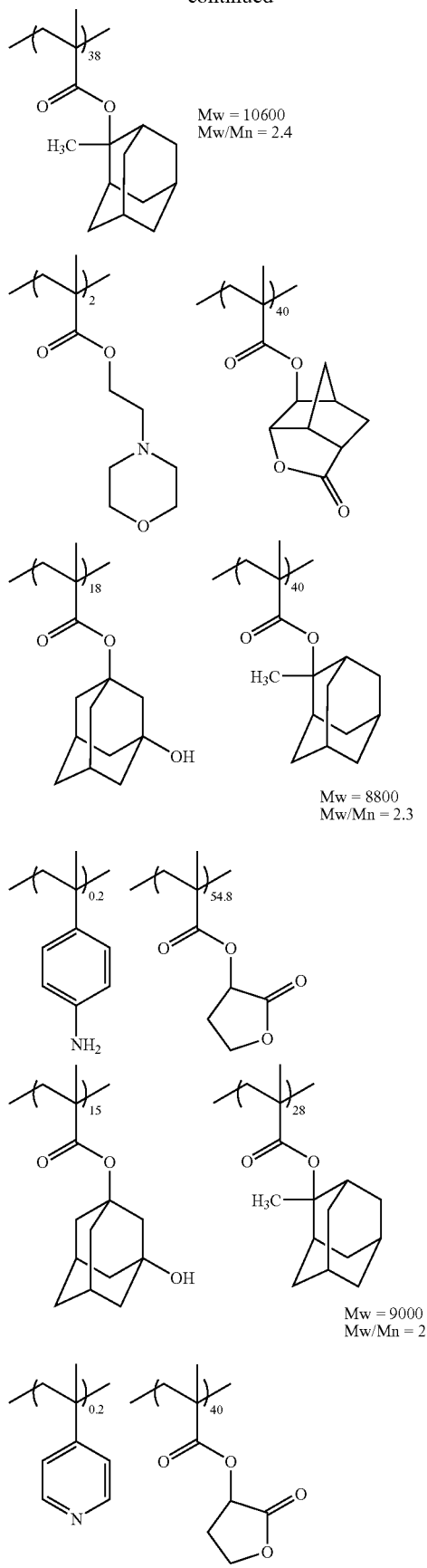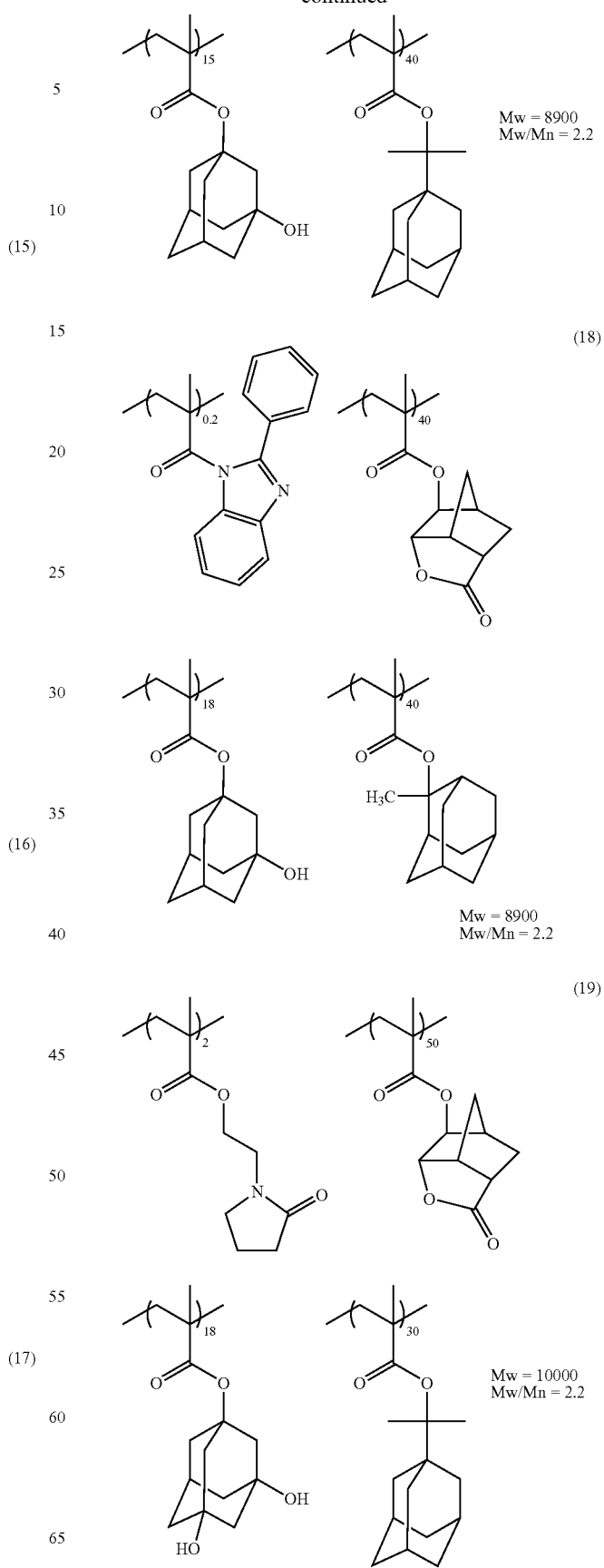

-continued

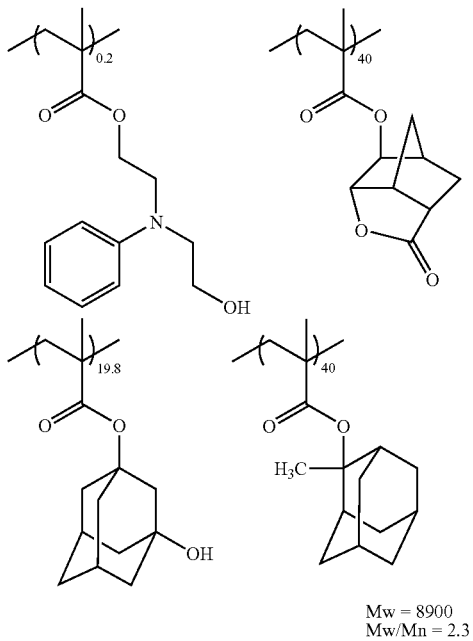

(20)

Mw = 8900
Mw/Mn = 2.3

Examples 1 to 18 Comparative Examples 1 and 2

Preparation of Resist:

The components shown in Table 1 below were dissolved in a solvent to prepare a solution having solid concentration of 10 mass %, and the resulting solution was filtered through a polyethylene filter having a pore diameter of 0.1 μm to prepare a positive resist composition. The obtained positive resist composition was evaluated according to the following manner. The results obtained are shown in Table 1.

Evaluation of Exposure Latitude:

An organic anti-reflection film ARC29A (manufactured by Nissan Chemical Industries, Ltd.) was coated on a silicone wafer, and the coating was baked at 205° C. for 60 seconds to thereby form an anti-reflection film having a thickness of 78 nm. The above-prepared positive resist solution was coated on the anti-reflection film and baked at 115° C. for 60 seconds, whereby a resist film having a thickness of 200 nm was formed. The obtained wafer was subjected to pattern exposure with an ArF excimer laser scanner (PAS5500/1100, NA0.75, σo/σi=0.85/0.55, manufactured by ASLM). After that, the wafer was heated at 120° C. for 60 seconds, and subjected to development with a tetramethylammonium hydroxide aqueous solution (2.38 mass %) for 30 seconds, rinsed with pure water, and spin-dried to obtain a resist pattern.

Post-bake was performed immediately after exposure. Taking the exposure amount required to reproduce the mask pattern of line and space of line width 80 nm as the optimal exposure amount, the breadth of exposure amount tolerating 80 nm±10% of a pattern size when exposure amount was varied was found. The obtained value was divided by the optimal exposure amount and the exposure latitude was shown in percentage. After aging in the environment of ammonia concentration of 5 ppb for 1 hour from exposure, the resist film was heated, and the exposure latitude after aging was computed in the same manner.

The greater the value of the exposure latitude, the smaller is the fluctuation of performance by the variation of exposure amount and exposure latitude is good. Further, the exposure latitude stability by the presence or absence of aging was computed according to the following expression. The smaller the value, the smaller is the fluctuation of exposure latitude, so that excellent in stability.

Exposure latitude stability=(exposure latitude of the time when post bake was performed just after exposure (%))−(exposure latitude of the time when post bake was performed 1 hour after exposure (%))

Evaluation of Sensitivity Variation:

An anti-reflection film (ARC25, manufactured by Brewer Science) was uniformly coated on a silicone substrate in a thickness of 600 Å with a spin coater and dried at 190° C. for 240 seconds.

In the next place, each positive resist solution was coated with a spin coater, and the wafer was dried by heating at 115° C. for 60 seconds to form a resist film having a thickness of 0.25 μm. The resist film was exposed with a laser of 193 nm, and the sensitivity by exposure of 193 nm of the resist film was evaluated with a laser exposure-dissolution behavior analyzer VUVES-4500 (manufactured by Litho Tech Japan Co., Ltd.) (dry sensitivity). In the next place, after forming a resist film on a silicone substrate in the same manner, the sensitivity by exposure of 193 nm was evaluated with an immersion exposure-dissolution behavior analyzer MODEL IMES-5500 (manufactured by Litho Tech Japan Co., Ltd.) (wet sensitivity).

The sensitivity here means that, after an exposed wafer is dried with heating at 120° C. for 60 seconds, the wafer is subjected to development with a 2.38 mass % tetramethylammonium hydroxide aqueous solution at 23° C. for 30 seconds, rinsed with pure water for 30 seconds and dried, and then the thickness is measured, at this time the minimum exposure amount required to make the thickness zero is the sensitivity.

The rate of change of sensitivity was measured according to the following expression, and this value was used as the index of compatibility (in common) of dry exposure/wet exposure.

Rate of change of sensitivity (%)=(wet sensitivity−dry sensitivity)/dry sensitivity=100

TABLE 1

| Ex. No. | Resin (2 g) (mass ratio) | Solvent (mass ratio) | Acid Generator | Basic Cpd. (2 mg) | Surfactant (10 mg) | Exposure Latitude (%) | Exposure Latitude Stability | Rate of Change of Sensitivity (%) |
|---|---|---|---|---|---|---|---|---|
| Ex. 1 | 1/13 (1/1) | SL-4/SL-6 (4/6) | z2 (0.05 g) | — | W-1 | 12.4 | 0.4 | 7 |
| Ex. 2 | 2/14 (1/1) | SL-4/SL-6 (4/6) | z11 (0.1 g) | — | W-4 | 15.5 | 0.3 | 8 |
| Ex. 3 | 3 | SL-4/SL-2 (5/5) | z11 (0.1 g) | N-1 | W-2 | 11.8 | 0.3 | 6 |
| Ex. 4 | 4 | SL-4/SL-5 (4/6) | z6 (0.15 g) | N-5 | W-1 | 12.8 | 0.4 | 9 |
| Ex. 5 | 5/14 (1/2) | SL-4/SL-6 (3/7) | z55 (0.2 g)/ z9 (0.01 g) | — | W-3 | 12.2 | 0.4 | 5 |

TABLE 1-continued

| Ex. No. | Resin (2 g) (mass ratio) | Solvent (mass ratio) | Acid Generator | Basic Cpd. (2 mg) | Surfactant (10 mg) | Exposure Latitude (%) | Exposure Latitude Stability | Rate of Change of Sensitivity (%) |
|---|---|---|---|---|---|---|---|---|
| Ex. 6 | 6/14 (1/2) | SL-4/SL-7 (7/3) | z2 (0.05 g) | — | W-4 | 11.6 | 0.3 | 6 |
| Ex. 7 | 7/13 (1/1) | SL-4/SL-5 (4/6) | z36 (0.2 g) | — | W-1 | 12.1 | 0.3 | 7 |
| Ex. 8 | 8/14 (1/2) | SL-4/SL-6 (4/6) | z55 (0.1 g) | — | W-1 | 14.7 | 0.2 | 8 |
| Ex. 9 | 9 | SL-4/SL-6/SL-9 (40/59/1) | z2 (0.08 g)/ z36 (0.04 g) | N-3 | W-2 | 15.9 | 0.3 | 11 |
| Ex. 10 | 10 | SL-4/SL-6/SL-8 (40/59/1) | z14 (0.08 g)/ z29 (0.02 g) | — | W-1 | 14.3 | 0.4 | 5 |
| Ex. 11 | 11 | SL-4/SL-6 (4/6) | z55 (0.15 g) | — | W-4 | 9.8 | 0.2 | 5 |
| Ex. 12 | 12/13 (1/1) | SL-2 | z58 (0.05 g)/ z42 (0.04 g) | — | W-2 | 14.2 | 0.3 | 10 |
| Ex. 13 | 15 | SL-4/SL-6 (4/6) | z2 (0.05 g) | — | W-1 | 12.4 | 0.4 | 7 |
| Ex. 14 | 16 | SL-4/SL-6 (4/6) | Z13 (0.1 g) | — | W-4 | 11 | 0.3 | 9 |
| Ex. 15 | 17 | SL-4/SL-6 (4/6) | Z11 (0.08 g) | N-1 | W-2 | 11.8 | 0.3 | 9 |
| Ex. 16 | 18 | SL-4/SL-6 (4/6) | Z13 (0.1 g) | — | W-1 | 12.5 | 0.3 | 6 |
| Ex. 17 | 19 | SL-4/SL-6 (4/6) | Z11 (0.1 g) | — | W-1 | 14.5 | 0.3 | 6 |
| Ex. 18 | 20 | SL-4/SL-6 (4/6) | Z13 (0.1 g) | N-3 | W-1 | 15 | 0.3 | 6 |
| Comp. Ex. 1 | 13 | SL-4/SL-6 (4/6) | z2 (0.05 g) | N-1 | W-1 | 11.0 | 0.8 | 40 |
| Comp. Ex. 2 | 14 | SL-4/SL-6 (4/6) | z11 (0.1 g) | N-1 | W-1 | 14.2 | 1.2 | 50 |

The abbreviations in Table 1 are as follows.
N-1: N,N-Dibutylaniline
N-2: N,N-Dipropylaniline
N-3: N,N-Dihydroxyethylaniline
N-4: 2,4,5-Triphenylimidazole
N-5: Hydroxyantipyrine
W-1: Megafac F176 (fluorine, manufactured by Dainippon Ink and Chemicals Inc.)
W-2: Megafac R08 (fluorine and silicon, manufactured by Dainippon Ink and Chemicals Inc.)
W-3: Polysiloxane polymer KP-341 (silicon, manufactured by Shin-Etsu Chemical Co., Ltd.)
W-4: PF6520 (fluorine, manufactured by OMNOVA)
SL-2: Cyclohexanone
SL-4: Propylene glycol monomethyl ether acetate
SL-5: Ethyl lactate
SL-6: Propylene glycol monomethyl ether
SL-7: 2-Heptanone
SL-8: γ-Butyrolactone
SL-9: Propylene carbonate It is seen from the results in Table 1 that the positive resist compositions in the invention show good exposure latitude, fluctuation of exposure latitude by aging from exposure to post bake is small, and the rate of change of sensitivity between ordinary exposure and immersion exposure is small.

Evaluation of Immersion Exposure:

A solution having solids concentration of 6 mass % was prepared by dissolving each component in Examples 1 to 18 shown in Table 1 in a solvent, and each solution was filtered through a polyethylene filter having a pore diameter of 0.1 µm to prepare a positive resist solution. The obtained positive resist solution was evaluated in the following manner.

An organic anti-reflection film ARC29A (manufactured by Nissan Chemical Industries, Ltd.) was coated on a silicone wafer, and the coating was baked at 205° C. for 60 seconds to thereby form an anti-reflection film having a thickness of 78 nm. The above-prepared positive resist solution was coated on the anti-reflection film and baked at 115° C. for 60 seconds, whereby a resist film having a thickness of 150 nm was formed. The obtained wafer was subjected to immersion exposure with an ArF excimer laser immersion scanner (NA 0.75). As the immersion liquid, super pure water having impurities of 5 ppb or less was used. After that, the wafer was heated at 120° C. for 60 seconds, and subjected to development with a tetramethylammonium hydroxide aqueous solution (2.38 mass %) for 30 seconds, rinsed with pure water, and spin-dried to obtain a resist pattern The compositions in Examples 1 to 18 also exhibited excellent image forming property in the exposure method via an immersion liquid.

This application is based on Japanese patent application JP 2005-060391, filed on Mar. 4, 2005, the entire content of which is hereby incorporated by reference, the same as if set forth at length

What is claimed is:

1. A positive resist composition, which comprises a resin having a structure showing a basicity and capable of increasing the solubility in an alkali developer by the action of an acid, and wherein the resin has the structure showing a basicity at a side chain, the resin has a lactone group, and the resin comprises a repeating unit having a partial structure containing an alicyclic hydrocarbon represented by formula (pI) or (pII):

wherein Z represents an atomic group necessary to form an alicyclic hydrocarbon group with a carbon atom; $R_{11}$ represents a methyl group, an ethyl group, an n-propyl group, an isopropyl group, an n-butyl group, an isobutyl group or a sec-butyl group; $R_{12}$, $R_{13}$ and $R_{14}$ each represents a straight chain or branched chain alkyl group having from 1 to 4 carbon atoms, or an alicyclic hydrocarbon group, provided that at least one of $R_{12}$ to $R_{14}$ represents an alicyclic hydrocarbon group; and wherein the resin comprises a repeating unit represented by formula (AI) as the repeating unit having the lactone group:

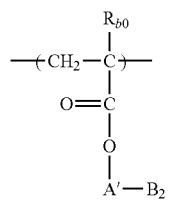

(AI)

wherein $R_{b0}$ represents a hydrogen atom, a halogen atom, or an alkyl group having from 1 to 4 carbon atoms; A' represents a single bond, an ether group, an ester group, a carbonyl group, an alkylene group, or a divalent linking group combining these groups; and $B_2$ represents a group represented by formula (Lc) or formula (III-1):

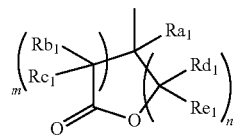

(Lc)

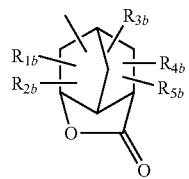

(III-1)

wherein $R_{a1}$, $R_{b1}$, $R_{c1}$, $R_{d1}$ and $R_{e1}$ each represents a hydrogen atom or an alkyl group; m and n each represents an integer of from 0 to 3, and m+n is from 2 to 6; $R_{1b}$, $R_{2b}$, $R_{3b}$, $R_{4b}$, and $R_{5b}$ each represents a hydrogen atom, an alkyl group, a cycloalkyl group, an alkoxyl group, an alkoxycarbonyl group, an alkylsulfonylimino group or an alkenyl group, and two of $R_{1b}$ to $R_{5b}$ may be bonded to form a ring.

2. The positive resist composition as claimed in claim 1, wherein the structure showing a basicity is a structure including at least one selecting from the group consisting of a primary, secondary or tertiary aliphatic amine, an aromatic amine, and a heterocyclic amine.

3. The positive resist composition as claimed in claim 1, which comprises (B) a compound capable of generating an acid upon irradiation with an actinic ray or radiation.

4. The positive resist composition as claimed in claim 1, wherein the resin comprises a repeating unit represented by any of formulae (P1), (P2) and (P3) as the repeating unit having the structure showing a basicity:

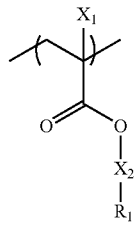

(P1)

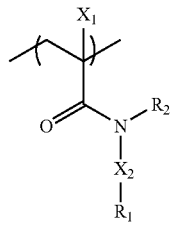

(P2)

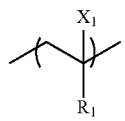

(P3)

wherein $X_1$ represents a hydrogen atom or an alkyl group; $X_2$ represents a single bond or a divalent linking group; $R_1$ represents a structure showing basicity; $R_2$ represents a hydrogen atom or an alkyl group, and $R_1$ and $R_2$ may be linked to each other to form a ring.

5. The positive resist composition as claimed in claim 1, wherein the resin comprises a repeating unit represented by any of formulae (P4), (P5), (P6), (P7), (P8), (P9), and (P10) as the repeating unit having the structure showing a basicity:

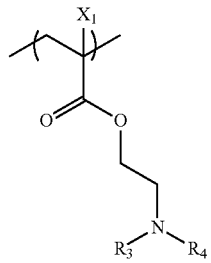

(P4)

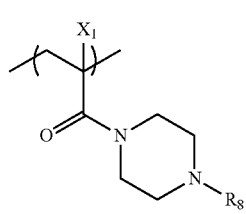

(P5)

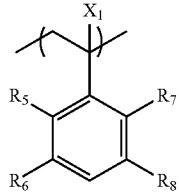

(P6)

(P7) 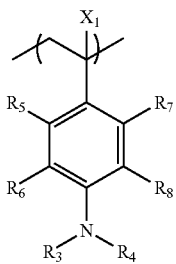

(P8) 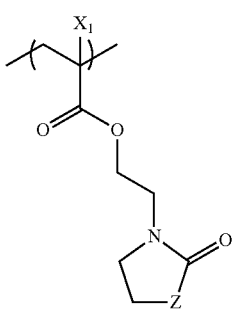

(P9) 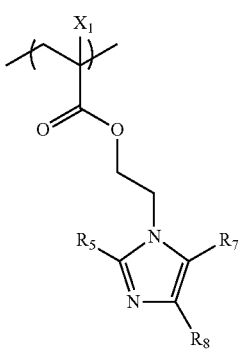

(P10) 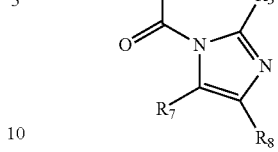

wherein $X_1$ represents a hydrogen atom or an alkyl group; $R_3$ to $R_9$ each independently represents a hydrogen atom, an alkyl group, a cycloalkyl group, an alkenyl group, an aryl group, or an aralkyl group; $R_3$ and $R_4$ may be bonded to each other to form a ring; $R_5$ and $R_6$ and $R_7$ and $R_8$ may be bonded to each other to form a ring; and Z represents alkylene or —NH—.

6. The positive resist composition as claimed in claim 1, wherein in formula (pI), $R_{11}$ represents a methyl group, an ethyl group, an n-propyl group, an n-butyl group, an isobutyl group, or a sec-butyl group, and the content of the repeating unit having a partial structure containing an alicyclic hydrocarbon represented by formula (pI) and/or (pII) is from 20 to 65 mol % in all the repeating structural units of the resin.

7. The positive resist composition as claimed in claim 1, wherein the resin contains only the repeating unit having a partial structure containing an alicyclic hydrocarbon represented by formula (pI) and/or (pII) as an acid-decomposable group, and in formula (pI), $R_{11}$ represents a methyl group, an ethyl group, an n-propyl group, an n-butyl group, an isobutyl group, or a sec-butyl group.

8. A pattern-forming method, which comprises forming a resist film with the positive resist composition as claimed in claim 1; and exposing and developing the resulting resist film.

9. The pattern-forming method as claimed in claim 8, wherein the resist film is subjected to an exposure through an immersion liquid.

10. A pattern-forming method which comprises the steps of:
providing a positive resist composition as claimed in claim 3;
forming a resist film with the positive resist composition;
pattern-wise exposing the resist film through an immersion liquid; and
developing the resulting resist film.

* * * * *